(12) United States Patent
Hudeczek et al.

(10) Patent No.: US 11,201,151 B2
(45) Date of Patent: Dec. 14, 2021

(54) RESONANT FIN TRANSISTOR (RFT)

(71) Applicant: Intel Corporation, Santa Clara, CA (US)

(72) Inventors: Richard Hudeczek, Munich (DE); Philipp Riess, Munich (DE); Richard Geiger, Munich (DE); Peter Baumgartner, Munich (DE)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 16/833,094

(22) Filed: Mar. 27, 2020

(65) Prior Publication Data
US 2021/0305245 A1 Sep. 30, 2021

(51) Int. Cl.
H01L 27/088 (2006.01)
H01L 29/423 (2006.01)
H01L 29/78 (2006.01)
H01L 29/06 (2006.01)

(52) U.S. Cl.
CPC ...... *H01L 27/0886* (2013.01); *H01L 29/0673* (2013.01); *H01L 29/42356* (2013.01); *H01L 29/785* (2013.01)

(58) Field of Classification Search
CPC .. H01L 27/0203; H01L 29/785; H01L 27/098
See application file for complete search history.

(56) References Cited

U.S. PATENT DOCUMENTS

| 9,663,346 | B1 | 5/2017 | Bahr |
| 9,899,363 | B1 | 2/2018 | Bahr |
| 10,002,859 | B1 | 6/2018 | Bahr |
| 10,121,882 | B1 | 11/2018 | Ho |
| 2014/0292429 | A1 | 10/2014 | Manipatruni et al. |
| 2017/0140992 | A1 | 5/2017 | Chang |
| 2020/0027735 | A1 | 1/2020 | Wang |
| 2021/0066100 | A1* | 3/2021 | Liaw ............... H01L 29/785 |

OTHER PUBLICATIONS

Bichoy Bahr, Yanbo He, Zoran Krivokapic, Srinivasa Banna, Dana Weinstein, "32GHz Resonant-Fin Transistors in 14nm FinFET Technology", Feb. 11-15, 2018, IEEE International Solid—State Circuits Conference—(ISSCC 2018), Session 21, p. 348-349 (Year: 2018).*

Search Report from European Patent Application No. 20208315.0, dated May 21, 2021,13 pgs.

Bahr Bichoy et al.: "32GHz resonant-fin transistors in 14nm FinFET technology", 2018 IEEE International Solid—State Circuits Conference—(ISSCC), IEEE, Feb. 11, 2018 (Feb. 11, 2018), pp. 348-350, XP033328464, DOI: 10.1109/ISSCC.2018.8310327 [retrieved on Mar. 8, 2018].

* cited by examiner

*Primary Examiner* — Changhyun Yi
(74) *Attorney, Agent, or Firm* — Schwabe, Williamson & Wyatt, P.C.

(57) ABSTRACT

Embodiments disclosed herein include resonators, such as resonant fin transistors (RFTs). In an embodiment a resonator comprises a substrate, a set of contact fins over the substrate, a first contact proximate to a first end of the set of contact fins, and a second contact proximate to a second end of the set of contact fins. In an embodiment, the resonator further comprises a set of skip fins over the substrate and adjacent to the set of contact fins. In an embodiment, the resonator further comprises a gate electrode over the set of contact fins and the set of skip fins, wherein the gate electrode is between the first contact and the second contact.

24 Claims, 25 Drawing Sheets

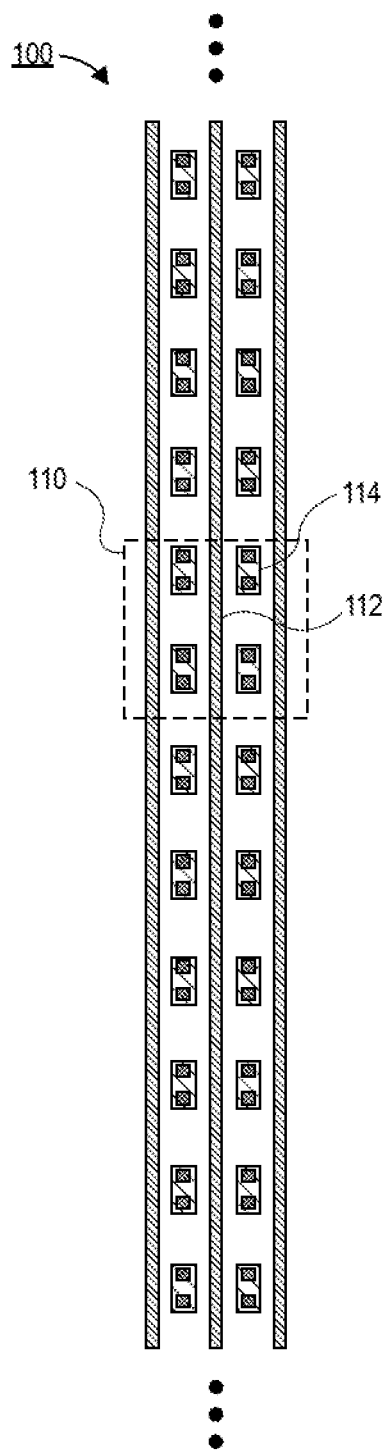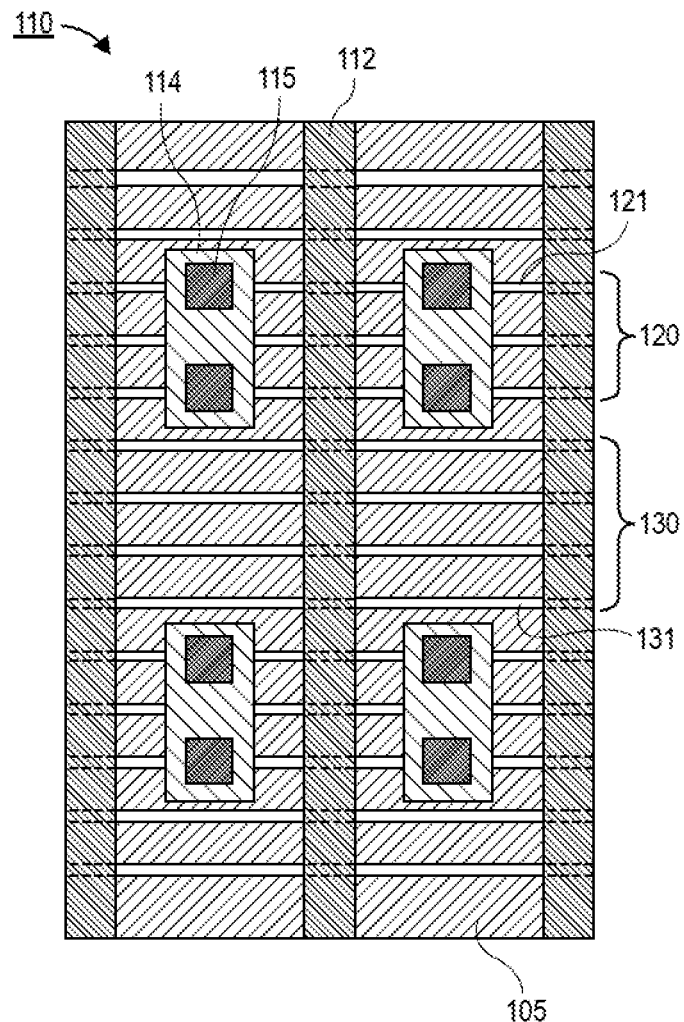
FIG. 1A
FIG. 1B

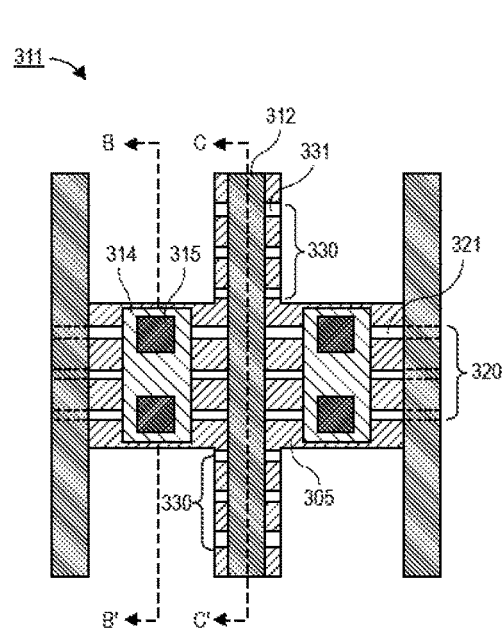
FIG. 3A
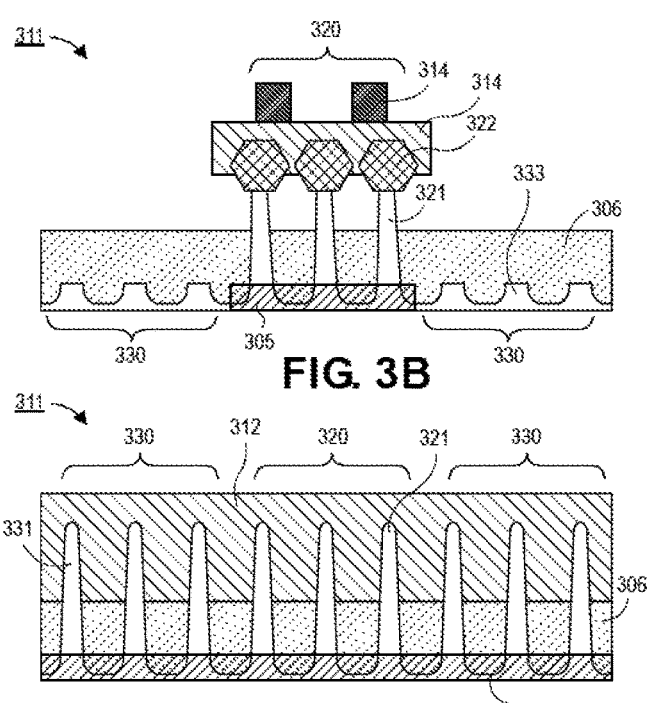
FIG. 3B
FIG. 3C

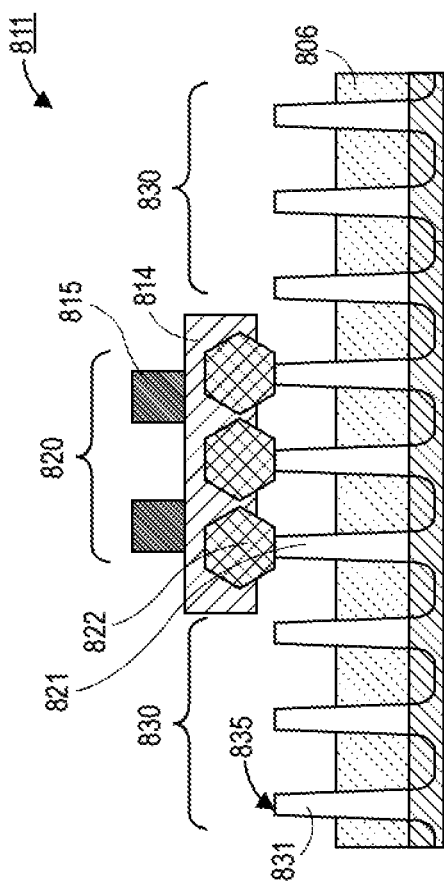
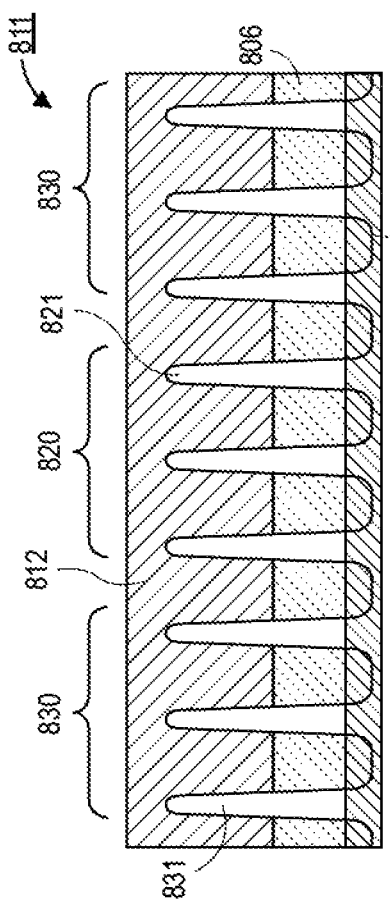
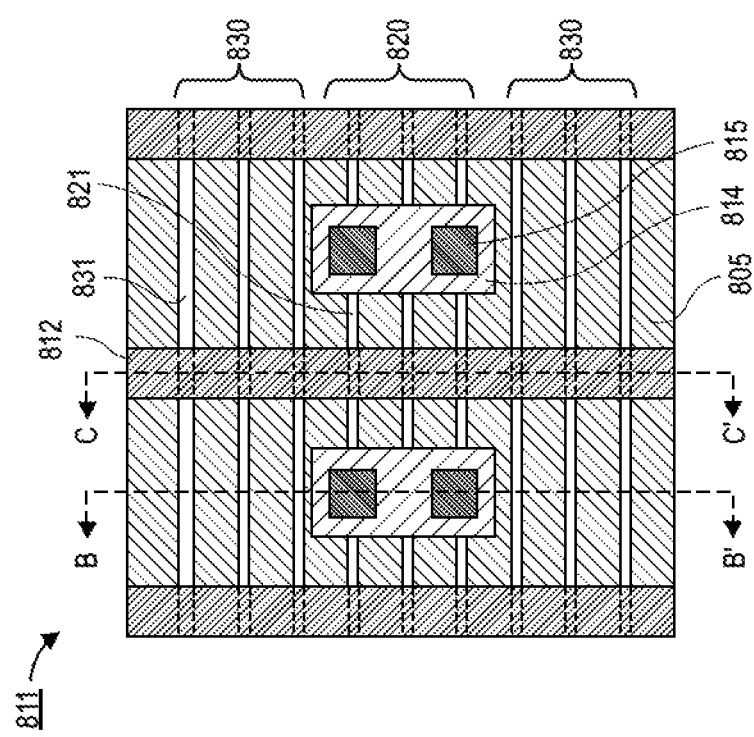
FIG. 8B
FIG. 8C
FIG. 8A

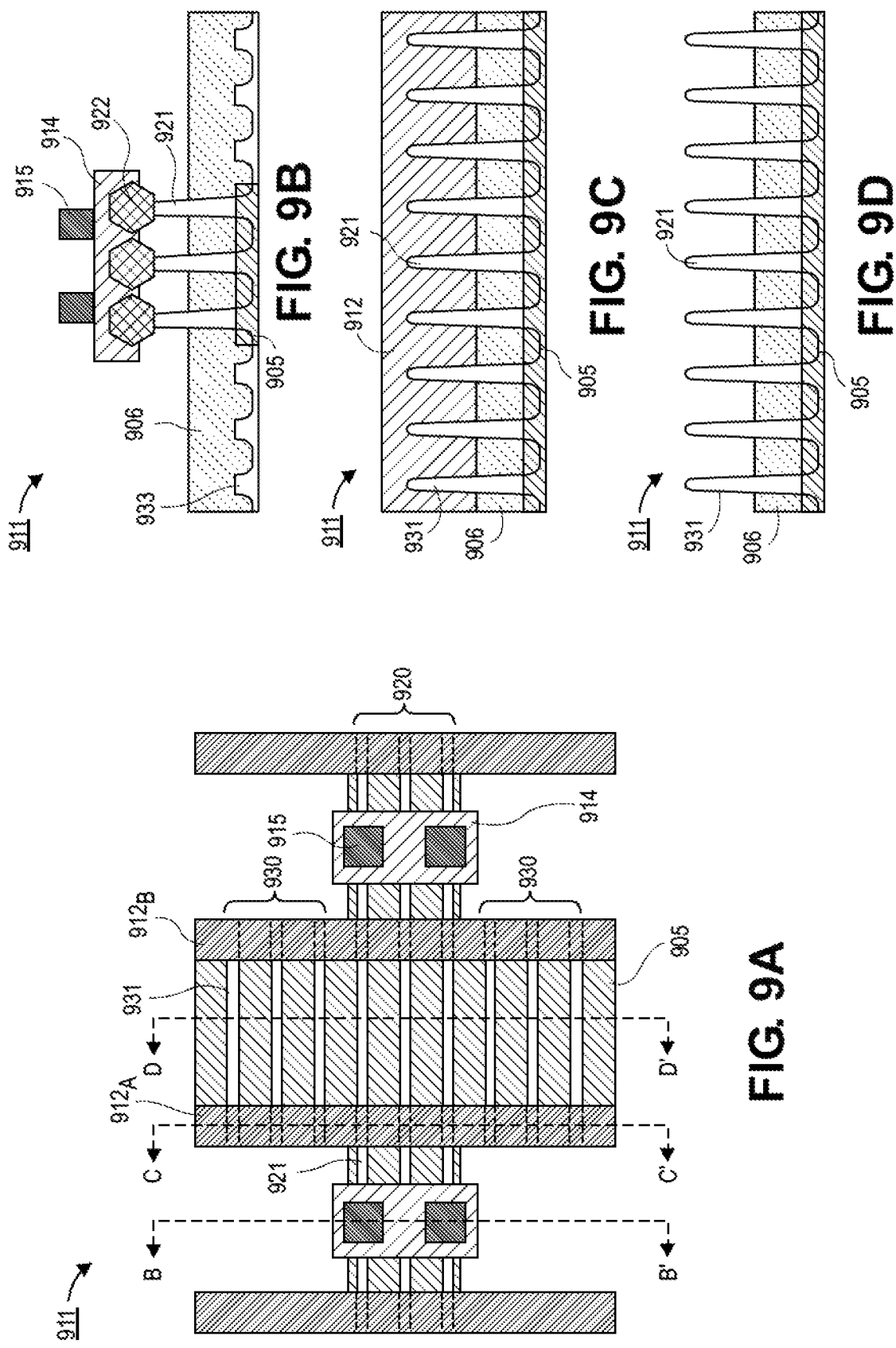

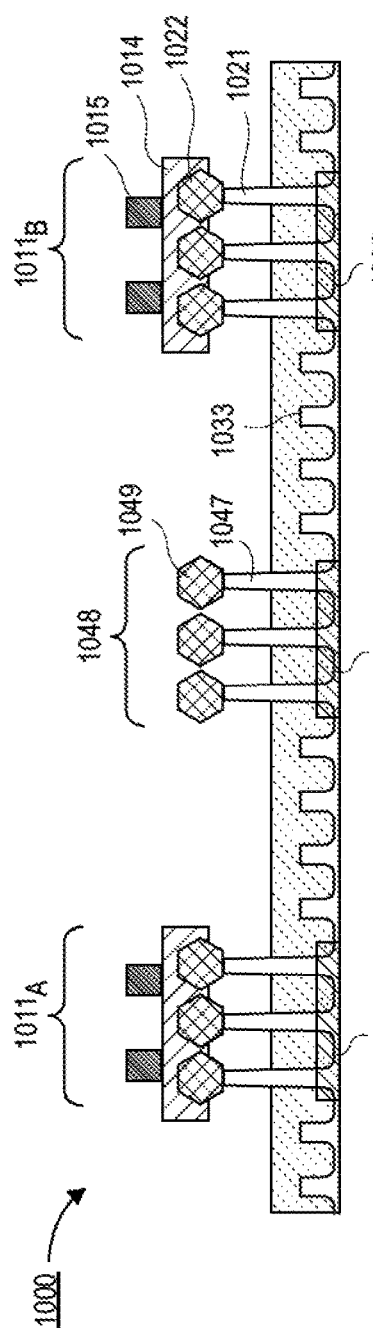
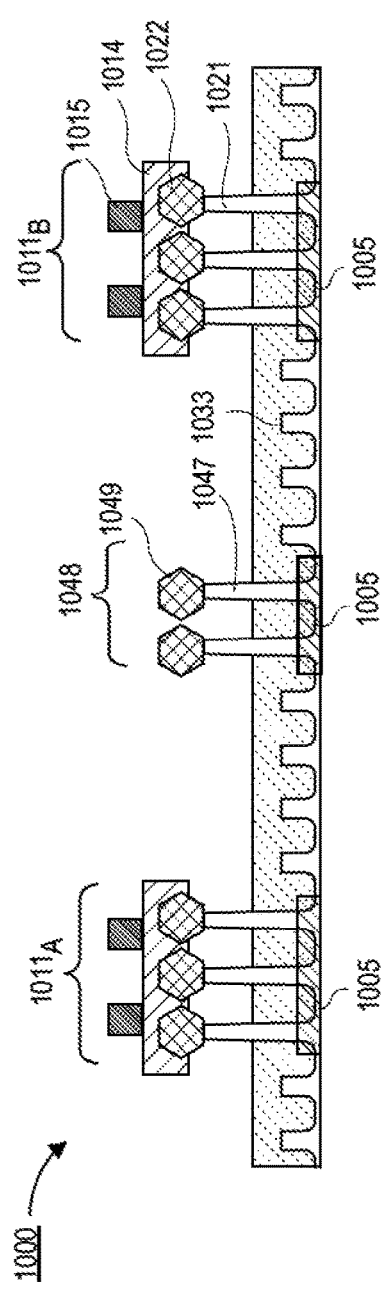
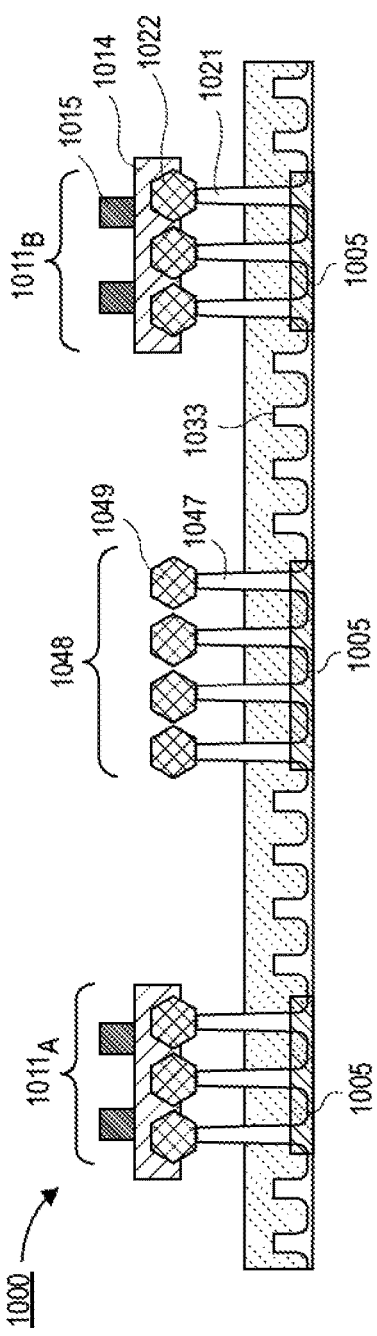

RESONANT FIN TRANSISTOR (RFT)

TECHNICAL FIELD

Embodiments of the present disclosure relate to semiconductor devices, and more particularly to resonant fin transistors (RFTs).

BACKGROUND

An oscillator may include an electric circuit that produces a periodically varying output at a controlled frequency. Filters may be implemented in circuits that selectively pass certain elements of a signal while eliminating other elements of the signal. A resonator may include circuitry that exhibits resonant behavior (i.e., naturally oscillates at resonant frequencies with greater amplitude than at other non-resonant frequencies). Oscillators, inductors, resonators and the like may use quartz crystals, inductors, and/or capacitors to generate or promote certain signal frequencies. However, such components can be expensive, unstable, and/or have too large of a footprint (making them less suitable for inclusion on, for example, a "system on a chip" (SoC) that may include logic circuits as well).

BRIEF DESCRIPTION OF THE DRAWINGS

FIG. 1A is a plan view illustration of a resonant fin transistor (RFT), in accordance with an embodiment.

FIG. 1B is a zoomed in portion of the RFT in FIG. 1A, in accordance with an embodiment.

FIGS. 3A-3C are illustrations of an RFT cell that comprises skip fins that are local to the gate electrode, in accordance with an embodiment.

FIGS. 8A-8C are illustrations of an RFT cell that comprises an epitaxial tip only over the contact fins, in accordance with an embodiment.

FIGS. 9A-9D are illustrations depicting an RFT cell that comprises a dual gate structure, in accordance with an embodiment.

FIGS. 10A-10C are cross-sectional illustrations depicting RFTs in accordance with different embodiments.

EMBODIMENTS OF THE PRESENT DISCLOSURE

Figure 2A:
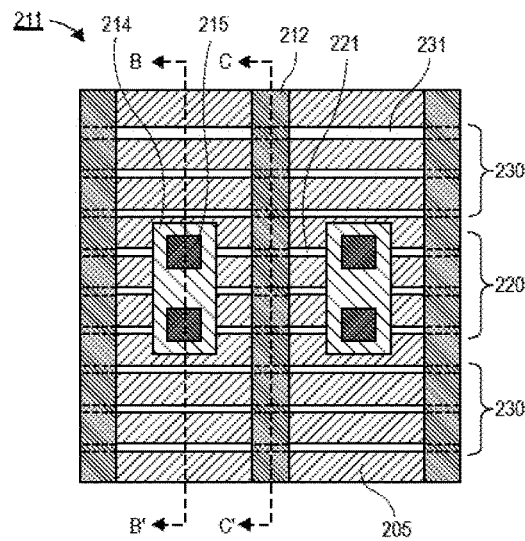
FIGS. 2A-2C are illustrations of a cell of the RFT, in accordance with an embodiment.

Described herein are resonant fin transistors (RFTs) with various architectures and interconnect schemes, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, resonators used in modern electronic typically include quartz crystals, inductors, and/or capacitors to generate or promote certain signal frequencies. However, such components are cost and size intensive. Accordingly, embodiments disclosed herein include resonant fin transistors (RFTs). An RFT is a resonating periodic structure, consisting of many parallel fins inside a common connected metal gate. Upon correct electrical excitation of the structure the fins start to resonate mechanically. The induced mechanic resonance leads to an oscillating stress inside the fins which can be picked up as a change in current through them. For the resonance being able to emerge and travel across the whole structure it is necessary to have a periodic placement of fins inside the gate, preferentially without omitting any fins. The frequency of the structure is mainly determined by the fin pitch of the structure which is inversely proportional to the resulting frequency of the system, as shown in Equation 1. Accordingly, in order to enable the largest possible resonant frequencies inside the structure, a high density and periodicity of fins inside the gate is needed.

$$f_{res} \sim \frac{1}{fin\ pitch} \qquad \text{Equation 1}$$

Referring now to FIG. 1A, a plan view illustration of an RFT 100 is shown, in accordance with an embodiment. As shown, the RFT 100 is composed of repeating cells with a common gate electrode 112 spanning across all of the cells. In some embodiments, the RFT 100 may comprise a length of approximately 1 μm or greater, 10 μm or greater, or 100 μm or greater.

FIG. 1B provides a zoomed in illustration of a region 110 to more clearly see the structure of each cell. In an embodiment, the RFT 100 may comprise a plurality of substantially parallel fins 121/131. The fins 121 may be referred to as contact fins 121. The contact fins 121 are grouped into a set of contact fins 120. The fins 131 may be referred to as skip fins 131. The skip fins 131 are grouped into a set of skip fins 130. The fins 121/131 may be substantially similar to each other in some embodiments. In an embodiment, the fins 121/131 may be silicon fins. Though it is to be appreciated that other semiconductor materials (e.g., group III-V semiconductors) may be used in the fins 121/131 in some embodiments. In an embodiment, the set of contact fins 120 may comprise an odd number of contact fins 121. For example, the set of contact fins 120 may comprise one, three, five, or seven contact fins 121. In an embodiment, the set of skip fins 130 may comprise an even number of skip fins 131, including zero skip fins 131. For example, the set of skip fins 130 may comprise zero, two, four, six, or eight skip fins 131. In the illustrated embodiment, the open diffusion (OD) region 105 is shown. The OD region 105 defines where fins 121/131 will be populated. In the embodiment shown, the OD region 105 is blanketed so that the fins 121/131 are populated at all locations.

The set of contact fins 120 may be connected together by a contact 114. The contact 114 may sometimes be referred to as the contact metal. The contact 114 may be a polysilicon or another conductive material. The contact 114 may be connected to overlying conductive layers (not shown) in the back end of line (BEOL) stack by vias 115. The vias 115 may sometimes be referred to as Via0. In an embodiment, a pair of contacts 114 are provided for each set of contact fins 120. A first contact 114 may be for a source contact, and a second contact 114 may be for a drain contact. The contacts 114 are separated from each other by the gate electrode 112.

In an embodiment, the gate electrode 112 extends over both the skip fins 131 and the contact fins 121. In the illustrated embodiment, additional gate structures 112 are shown at the ends of the fins 121/131. However, it is to be appreciated that the additional gate structures may be dummy gate structures. That is, they are not part of the electrical circuitry of the RFT 100.

Figure 2B:
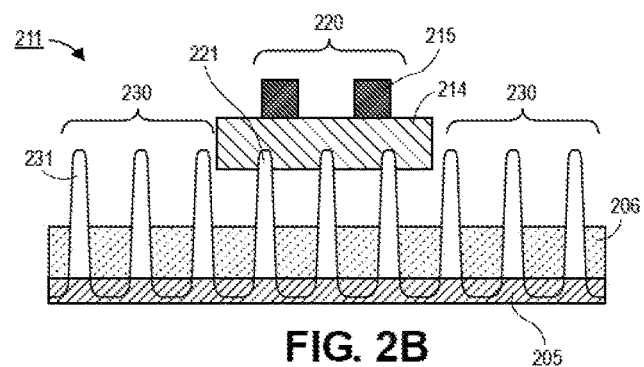
Figure 2C:
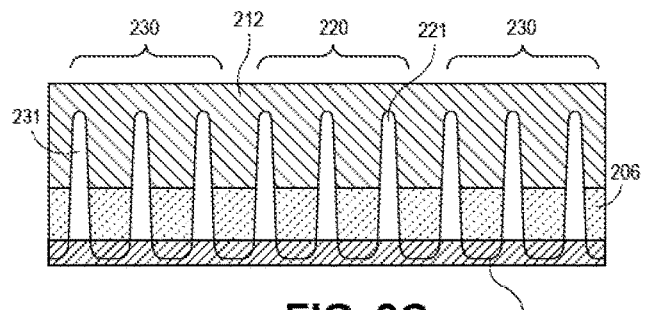

Referring now to FIGS. 2A-2C, a set of illustrations depicting of a cell 211 of an RFT is shown, in accordance with an embodiment. FIG. 2A provides a plan view illustration of the cell 211, FIG. 2B is a cross-sectional illustration of the cell 211 in FIG. 2A along line B-B', and FIG. 2C is a cross-sectional illustration of the cell 211 in FIG. 2A along line C-C'.

As shown in FIG. 2A, the cell 211 comprises a set of contact fins 220 and sets of skip fins 230 adjacent to the set of contact fins 220. The sets of skip fins 230 each are shown as having three skip fins 231. However, it is to be appreciated that a neighboring cell may also contribute three skip fins 231 to provide an even number of skip fins 231 between each set of contact fins 220. Additionally, any even number of skip fins 231, including zero skip fins 231 (i.e., an even number when combining neighboring cells 211) may be provided between sets of contact fins 220. In the illustrated embodiment, the set of contact fins 220 comprises three contact fins 221. However, it is to be appreciated that any odd number of contact fins 221 may be included in the set of contact fins 220. As shown in FIG. 2A, the OD region 205 is blanketed and all fin locations are populated.

Referring now to FIG. 2B, a cross-sectional illustration of the cell 211 through a contact 214 is shown, in accordance with an embodiment. As shown, the contact 214 electrically couples together the individual contact fins 221 in the set of contact fins 220. Vias 215 provide electrical connection to overlying layers (not shown) in the BEOL stack. Additionally, the skip fins 231 in the sets of skip fins 230 remain uncontacted. Lower portions of the fins 221/231 may be covered by an insulating layer 206, such as an oxide or the like.

Referring now to FIG. 2C, a cross-sectional illustration of the cell through the gate electrode 212 is shown, in accordance with an embodiment. As shown, each of the fins 221/231 are covered by the gate electrode 212. That is, within the gate electrode 212, the contact fins 221 and the skip fins 231 may be substantially the same in some embodiments. It is to be appreciated that other material layers between the gate electrode 212 and the fins 221/231 are omitted for simplicity. For example, gate dielectric layers, workfunction metal layers, and the like may also be included in the region of the gate electrode 212.

As indicated above, the portion of the skip fins 231 outside of the gate electrode 212 are not connected to the circuitry of the RFT. Accordingly, electrical isolation between the skip fins 231 and the contact fins 221 outside of the gate electrode needs to be maintained. However, as the pitch between the fins decreases (e.g., to provide a higher frequency response in the RFT) it becomes increasingly more difficult to maintain the electrical isolation. Exemplary shorting defects that may occur in RFT structures are shown in FIGS. 2D and 2E.

Figure 2D:
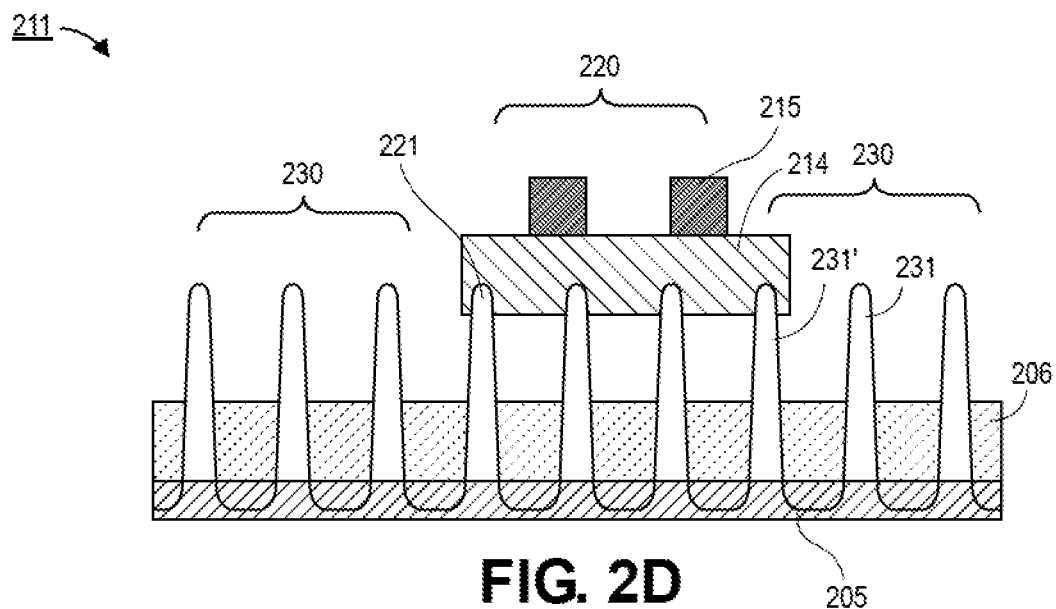
FIGS. 2D-2E are illustrations of RFTs that have contacts that are shorted to skip fins.

Referring now to FIG. 2D, a cross-sectional illustration through the contact 214 of a cell 211 is shown, in accordance with an embodiment. As shown, the contact 214 is misaligned. The misalignment results in the contact 214 being in contact with a skip fin 231'.

Figure 2E:
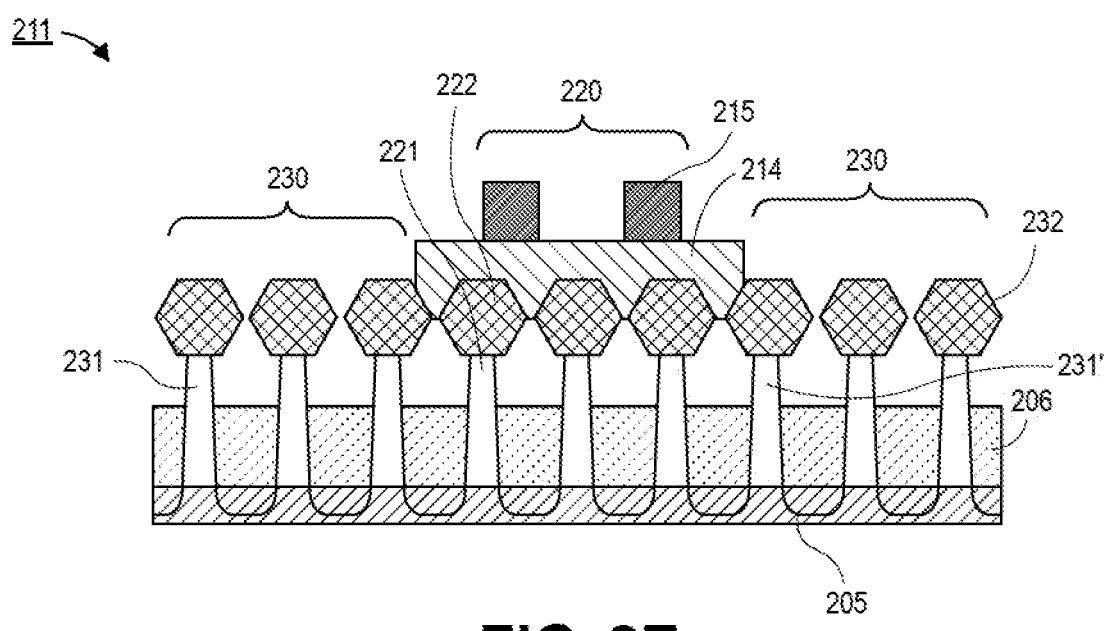

Even when the contact 214 is properly aligned, there may still be defects, as shown in FIG. 2E. This is because in some embodiments an epitaxial tip 232 is grown over the top of the fins 221/231. The epitaxial tip 232 may extend out laterally. As shown, the contact 214 may touch the epitaxial tip 232 of a skip fin 231'. Additionally, the epitaxial tip 232 of a skip fin 231 may grow and contact an epitaxial tip 222 of a contact fin 221. This also results in a defective RFT.

Accordingly, embodiments disclosed herein include RFT structures that provide protections against shorting between the skip fins 231 and the contact fins 221.

Referring now to FIGS. 3A-3C, a series of illustrations of an RFT cell 311 are shown, in accordance with an embodiment. FIG. 3A is a plan view illustration of the cell 311, FIG. 3B is a cross-sectional illustration of the cell 311 in FIG. 3A along line B-B', and FIG. 3C is a cross-sectional illustration of the cell 311 in FIG. 3A along line C-C'.

In an embodiment, the cell 311 comprises a set of contact fins 320 and sets of skip fins 330. In an embodiment, contact fins 321 in the set of contact fins 320 are contacted by a pair of contacts 314 (with vias 315). The contacts 314 are on opposite sides of a gate electrode 312, through which the contact fins 321 pass. As shown in FIG. 3B, an epitaxial tip 322 may be grown over portions of the contact fins 321 outside of the gate electrode 312. Within the gate electrode 312 (as shown in FIG. 3C) the contact fins 321 may be without the epitaxial tip 322. It is to be appreciated that other material layers between the gate electrode 312 and the fins 321/331 are omitted for simplicity. For example, gate dielectric layers, workfunction metal layers, and the like may also be included in the region of the gate electrode 312.

As shown, the skip fins 331 have a non-uniform height across their length. Within the gate electrode 312, the skip fins 331 may have a first height that substantially matches a height of the contact fins 321 within the gate electrode 312. Outside of the gate electrode 312, the skip fins 331 may have a second height that is smaller than a height of the contact fins 321 outside of the gate electrode 312. For example, outside of the gate electrode 312, the skip fins 331 may be referred to as fin stumps 333. The second height of the fin stumps 333 may be smaller than a height of an insulating layer 306. In some embodiments, the fin stumps 333 may be completely removed, so that there is substantially no remnant of the skip fin 331 outside of the gate electrode 312. Accordingly, there are no skip fins 331 immediately adjacent to the contact 314 or the contact fins 321 outside of the gate electrode 312. As such, the possibility of shorting to the skip fins 331 is eliminated while still maintaining the skip fins 331 within the gate electrode 312.

In an embodiment, the OD region 305 defines the locations where fins 321/331 are reduced in height. For example, the OD region 305 surrounds the entire set of contact fins 320 and encompasses the gate electrode 312. In an embodiment, the OD region 305 extends out from the gate electrode 312. That is, some portion of the skip fins 331 immediately adjacent to the gate electrode 312 may have the same height as the contact fins 321.

Figure 4A:
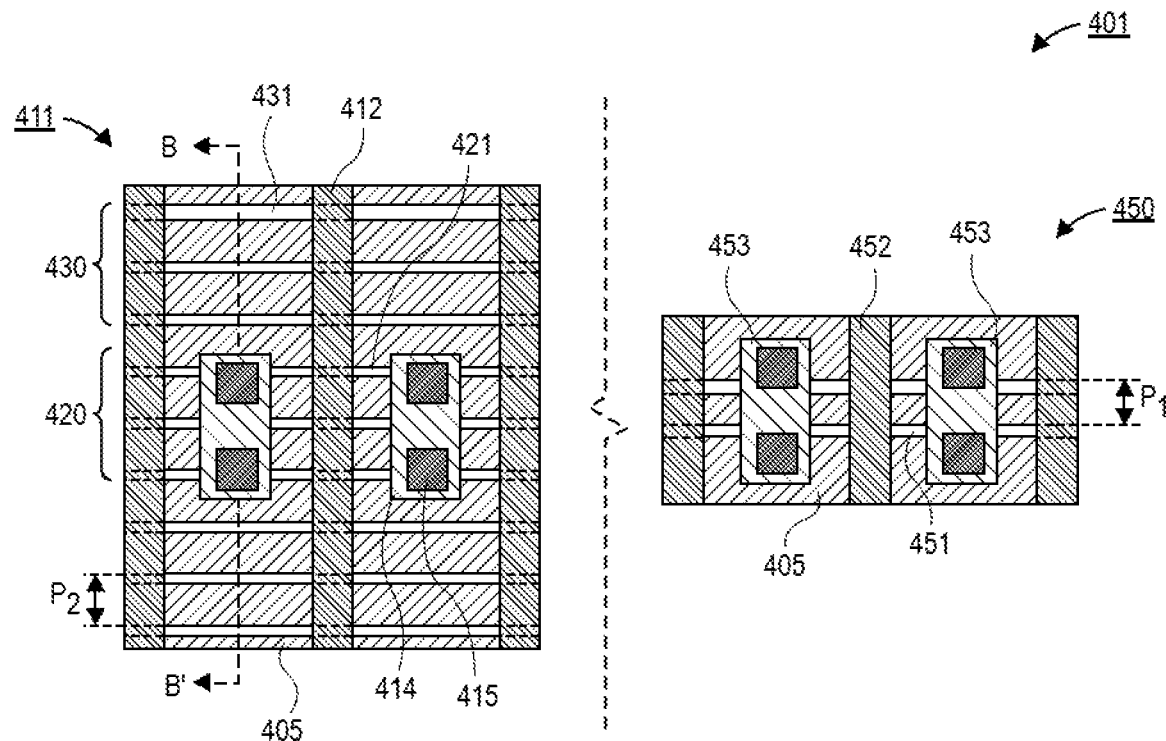
FIGS. 4A and 4B are illustrations of an RFT cell that has a fin pitch that is greater than a fin pitch of other structures on the die, in accordance with an embodiment.
Figure 4B:
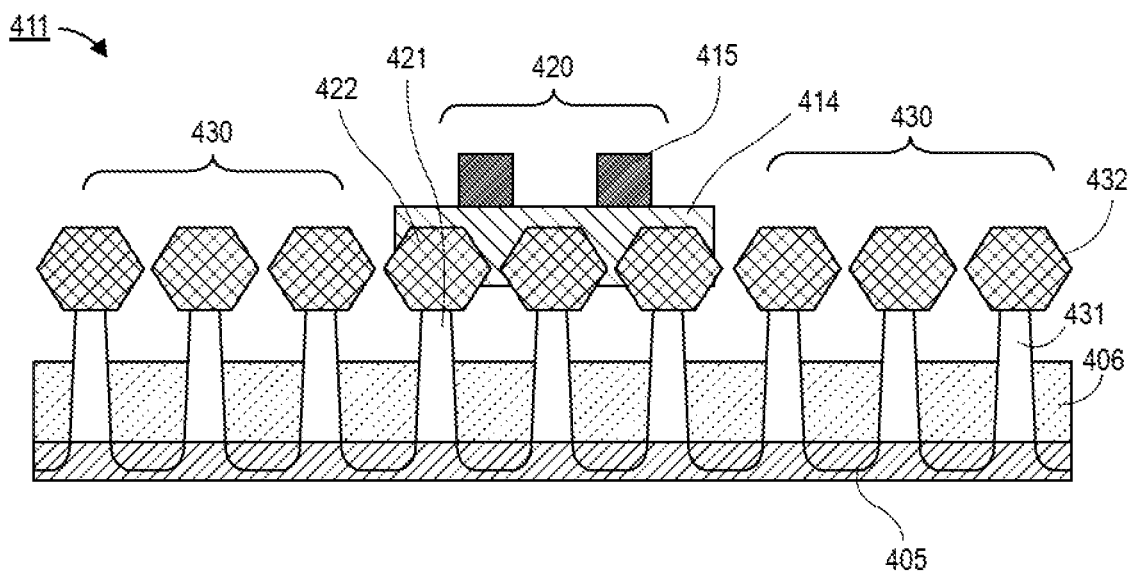

Referring now to FIGS. 4A and 4B, a pair of illustrations depicting an RFT cell 411 is shown, in accordance with an additional embodiment. FIG. 4A is a plan view illustration of a die 401 that comprises the cell 411 and an additional device 450. FIG. 4B is a cross-sectional illustration of the cell 411 in FIG. 4A along line B-B'.

In an embodiment, the cell 411 comprises a set of contact fins 420 and sets of skip fins 430. In an embodiment, the contact fins 421 in the set of contact fins 420 are contacted by a pair of contacts 414 (with vias 415). The contacts 414 are on opposite sides of a gate electrode 412, through which the contact fins 421 pass. As shown in FIG. 4B, an epitaxial tip 422 may be grown over portions the contact fins 421 outside of the gate electrode 412. Within the gate electrode 412 the contact fins 421 may be without the epitaxial tip 422. The skip fins 431 may also comprise an epitaxial tip 432. A cross-section of the cell 411 through the gate electrode 412 may be substantially similar to the cross-section in FIG. 3C above. In an embodiment, the skip fins 431 of the sets of skip fins 430 may also pass through the gate electrode 412. As shown in FIG. 4A, the OD region 405 is blanketed, and there may be no portions of the set of skip fins 430 and the set of contact fins 420 that are significantly modified, aside from the growth of the epitaxial tips 422/432.

In an embodiment, the cell 411 may be disposed on the same substrate as the additional device 450. The dashed line between the cell 411 and the additional device 450 indicates that the two features may be disposed at any location over the substrate. That is, the cell 411 and the additional device 450 may be on a single die 401. The additional device 450 may comprise device fins 451. In the particular embodiment shown in FIG. 4A, the additional device 450 is a transistor.

The additional device 450 may comprise contacts 453 on either side of a gate electrode 452. The device fins 451 pass through the gate electrode 452 and are contacted by the contacts 453. While a transistor is shown, it is to be appreciated that the device fins 451 may be part of any structure disposed on the die 401.

In an embodiment, the device fins 451 may have a first pitch $P_1$ and the fins 421/431 of the cell 411 may have a second pitch $P_2$. In an embodiment, the second pitch $P_2$ is larger than the first pitch $P_1$. The larger second pitch $P_2$ provides increased spacing between the fins 421/431 and reduces the chances of shorting to a skip fin 431. In an embodiment, the second pitch $P_2$ may be 10% larger, 25% larger, 50% larger, or 100% larger or more than the first pitch $P_1$. In other embodiments, the second pitch $P_2$ is smaller than the first pitch $P_1$ (e.g., to provide higher resonant frequencies).

Figure 5A:
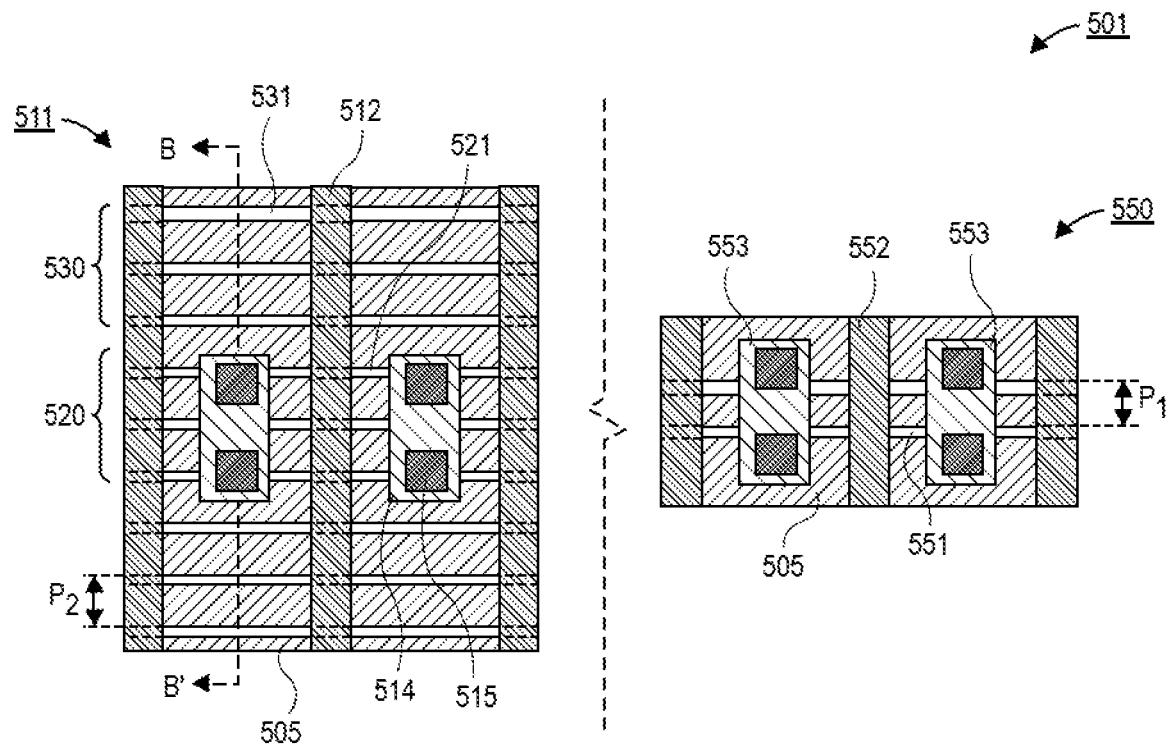
FIGS. 5A and 5B are illustrations of an RFT cell that has a fin pitch that is an integer multiple of the fin pitch of other structures on the die, in accordance with an embodiment.
Figure 5B:
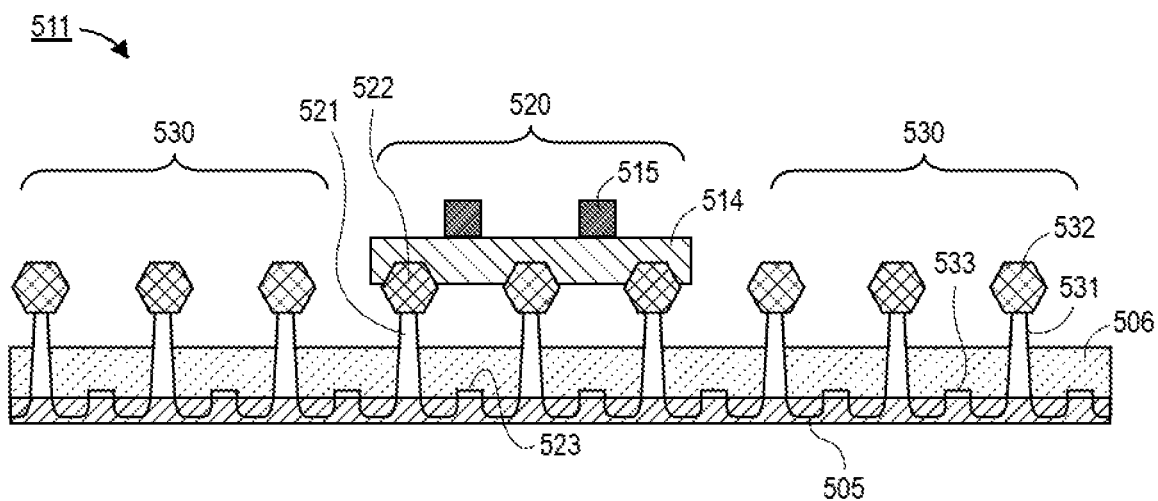

Referring now to FIGS. 5A and 5B, a pair of illustrations depicting an RFT cell 511 is shown, in accordance with an additional embodiment. FIG. 5A is a plan view illustration of a die 501 that comprises the cell 511 and an additional device 550. FIG. 5B is a cross-sectional illustration of the cell 511 in FIG. 5A along line B-B'.

FIG. 5A appears substantially similar to FIG. 4A. For example, the cell 511 may comprise a set of contact fins 520 and sets of skip fins 530. Contacts 514 and vias 515 are coupled to the contact fins 521. Additionally, the skip fins 531 and the contact fins 521 pass through a gate electrode 512. The OD region 505 may be blanketed. Similarly, the additional device 550 comprises device fins 551, contacts 553, and a gate electrode 552. The device fins 551 may have a first pitch $P_1$ and the fins 521/531 of the cell 511 may have a second pitch $P_2$.

FIG. 5B illustrates the difference between die 501 and die 401. As shown in FIG. 5B, fin stumps 523/533 are located between each of the fins 521/531. The fin stumps 523/533 are omitted from FIG. 5A for simplicity. The pitch between a fin stump 523/533 and a neighboring fin 521/531 may be equal to the first pitch $P_1$. Accordingly, the resulting second pitch $P_2$ between fins 521/531 is twice the first pitch $P_1$. While a single fin stump 523/533 is shown between each fin 521/531, it is to be appreciated that any number of fin stumps 523/533 may be between fins 521/531. As such, the second pitch $P_2$ may be any integer multiple of the first pitch $P_1$ in some embodiments. The additional spacing provided by the second pitch $P_2$ prevents shorting to the skip fins 531. The spacing also allows for increased growth of the fin tips 522/532.

Figure 6B:
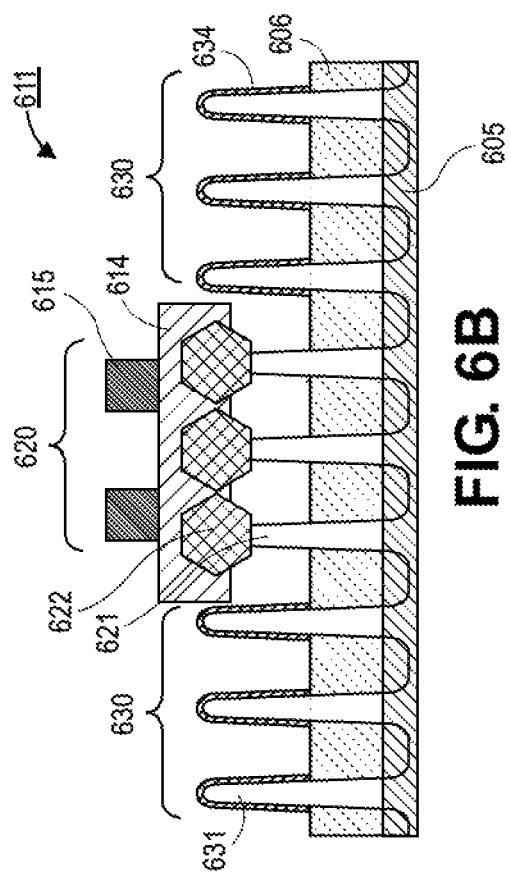
FIGS. 6A-6C are illustrations of an RFT cell that comprises skip fins with an electrically insulating layer over the fins outside of the gate electrode, in accordance with an embodiment.
Figure 6C:
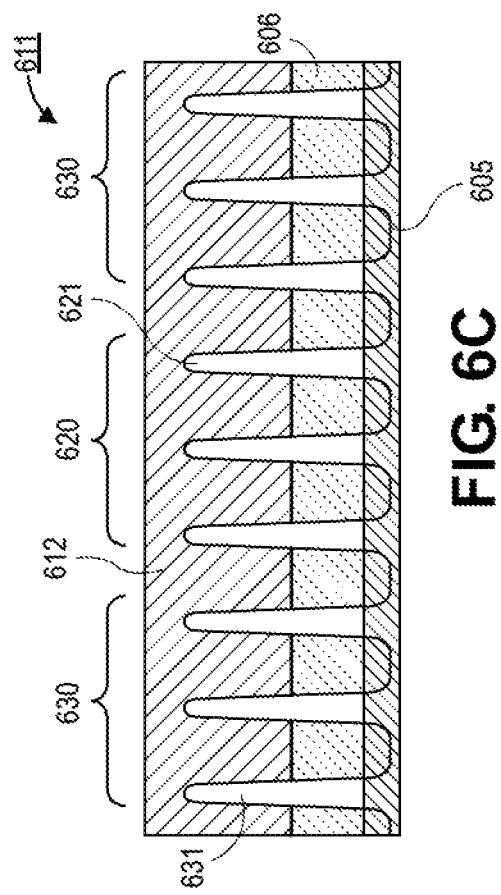
Figure 6A:
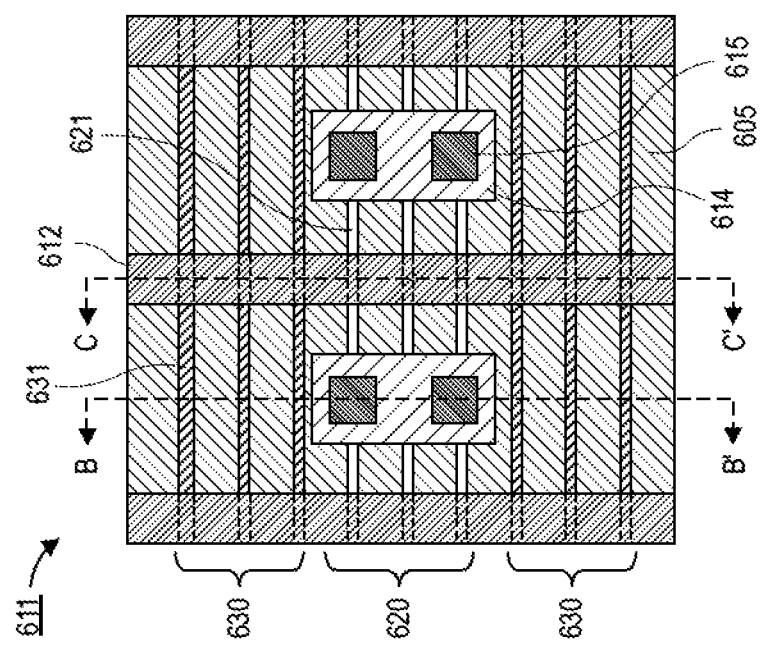

Referring now to FIGS. 6A-6C, a series of illustrations depicting an RFT cell 611 is shown, in accordance with an additional embodiment. FIG. 6A is a plan view illustration of the cell 611. FIG. 6B is a cross-sectional illustration of the cell 611 in FIG. 6A along line B-B'. FIG. 6C is a cross-sectional illustration of the cell 611 in FIG. 6A along line C-C'.

Referring now to FIG. 6A, the cell 611 comprises, a set of contact fins 620 and sets of skip fins 630. In an embodiment, the contact fins 621 in the set of contact fins 620 are contacted by a pair of contacts 614 (with vias 615). The contacts 614 are on opposite sides of a gate electrode 612, through which the contact fins 621 pass. As shown in FIG. 6B, an epitaxial tip 622 may be grown over portions of the contact fins 621 outside of the gate electrode 612. Within the gate electrode 612 (as shown in FIG. 6C) the contact fins 621 may be without the epitaxial tip 622. It is to be appreciated that other material layers between the gate electrode 612 and the fins 621/631 are omitted for simplicity. For example, gate dielectric layers, workfunction metal layers, and the like may also be included in the region of the gate electrode 612. As shown, the OD region 605 may be blanketed over the entirety of the set of contact fins 620 and the set of skip fins 630.

In an embodiment, an electrically insulating layer 634 may be disposed over portions of the skip fins 631. As shown in FIG. 6B, the electrically insulating layer 634 is over the upper portion of the skip fins 631 above the insulating layer 606. The electrically insulating layer 634 may be an oxide, a nitride, or the like. The electrically insulating layer 634 prevents the contact 614 or the fin tips 622 from shorting to a skip fin 631. As shown in FIG. 6C, the electrically insulating layer 634 is absent over the skip fins 631 within the gate electrode 612.

Figure 7B:
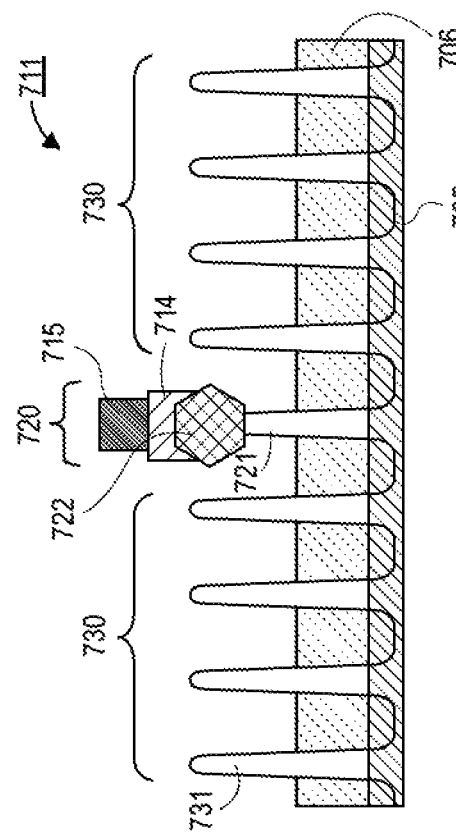
FIGS. 7A-7C are illustrations of an RFT cell that comprises a contact that has a reduced width, in accordance with an embodiment.
Figure 7C:
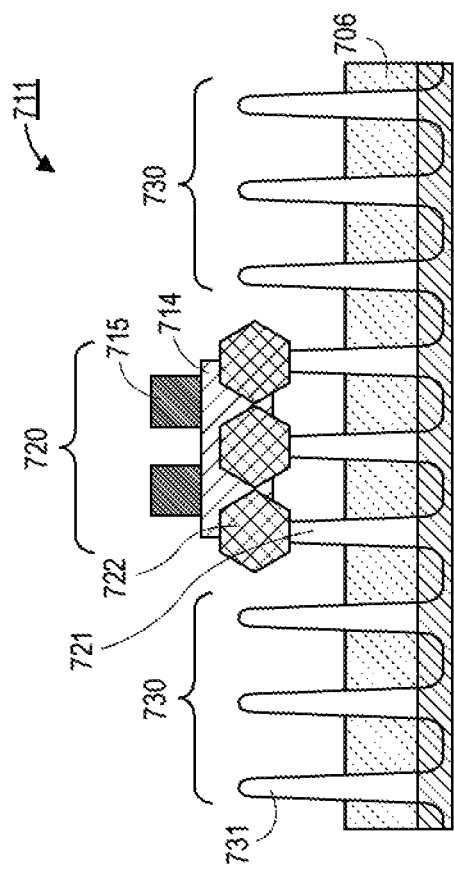
Figure 7A:
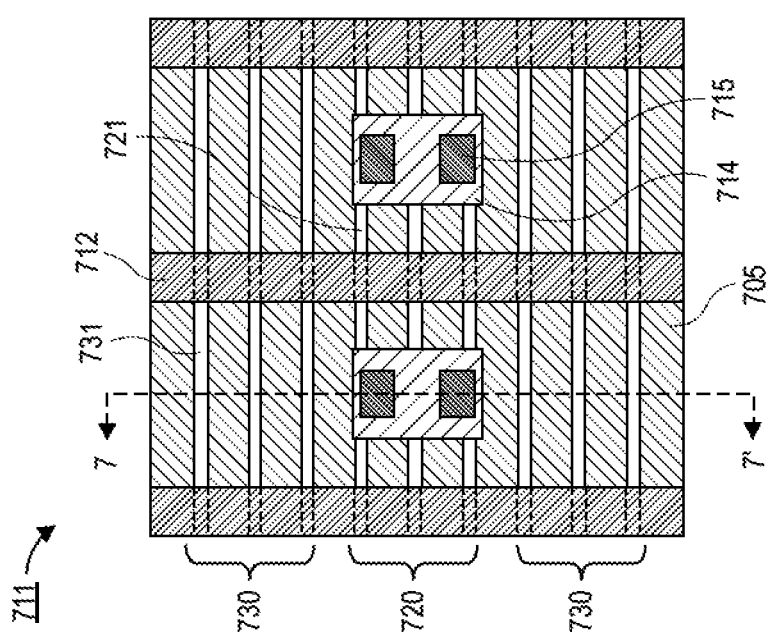

Referring now to FIGS. 7A-7C, a series of illustrations depicting an RFT cell 711 is shown, in accordance with an embodiment. FIG. 7A is a plan view illustration of the cell 711. FIG. 7B is a cross-sectional illustration of the cell 711 in FIG. 7A along line 7-7'. FIG. 7C is a cross-sectional illustration of a cell 711 in accordance with an additional embodiment.

In an embodiment, the cell 711 comprises, a set of contact fins 720 and sets of skip fins 730. In an embodiment, the contact fins 721 in the set of contact fins 720 are contacted by a pair of contacts 714 (with vias 715). The contacts 714 are on opposite sides of a gate electrode 712, through which the contact fins 721 pass. As shown in FIG. 7B, an epitaxial tip 722 may be grown over portions of the contact fins 721 outside of the gate electrode 712 and above the isolation layer 706. Within the gate electrode 712 the contact fins 721 may be without the epitaxial tip 722. As shown, the OD region 705 may be blanketed over the entirety of the set of contact fins 720 and the set of skip fins 730.

Referring now to FIG. 7B, the cross-sectional illustration depicts a contact with a reduced width. For example, a footprint of the contact 714 is entirely within the outer edges of the outermost contact fins 721. Reducing the width of the contact 714 provides a larger margin of error before a short to the skip fins 731 is made.

Referring now to FIG. 7C, a cell 711 in accordance with an additional embodiment is shown. As shown, the contact 714 only connects to a single contact fin 721. In such instances, the footprint of the contact 714 may be substantially similar to the footprint of the contact fin 721. For example, the width of the fin tip 722 may be wider than a width of the contact 714.

Referring now to FIGS. 8A-8C, a series of illustrations depicting an RFT cell 811 is shown, in accordance with an embodiment. FIG. 8A is a plan view of the cell 811. FIG. 8B is a cross-sectional illustration of the cell 811 in FIG. 8A along line B-B'. FIG. 8C is a cross-sectional illustration of the cell 811 in FIG. 8A along line C-C'.

In an embodiment, the cell 811 comprises, a set of contact fins 820 and sets of skip fins 830. In an embodiment, the contact fins 821 in the set of contact fins 820 are contacted by a pair of contacts 814 (with vias 815). The contacts 814 are on opposite sides of a gate electrode 812, through which the contact fins 821 pass. As shown in FIG. 8B, an epitaxial tip 822 may be grown over portions of the contact fins 821 outside of the gate electrode 812 and above the isolation layer 806. Within the gate electrode 812 the contact fins 821 may be without the epitaxial tip 822 (as shown in FIG. 8C). It is to be appreciated that other material layers between the gate electrode 812 and the fins 821/831 are omitted for simplicity. For example, gate dielectric layers, workfunction metal layers, and the like may also be included in the region of the gate electrode 812. As shown, the OD region 805 may be blanketed over the entirety of the set of contact fins 820 and the set of skip fins 830.

In an embodiment, the epitaxial tip 822 is only disposed over the contact fins 821. Preventing growth of an epitaxial tip over the skip fins 831 reduces the possibility of shorting the contact 814 to the skip fins 831. In an embodiment, tops of the skip fins 831 may have a substantially flat surface 835. That is the top surfaces may be recessed with an etching process implemented prior to the epitaxial growth. However, since the skip fins 831 are masked during the epitaxial growth, the flat surfaces 835 may remain in the final structure. However, it is noted that portions of the skip fins 831 within the gate electrode 812 maintain their original shape and look substantially similar to the contact fins 821.

Figure 8D:
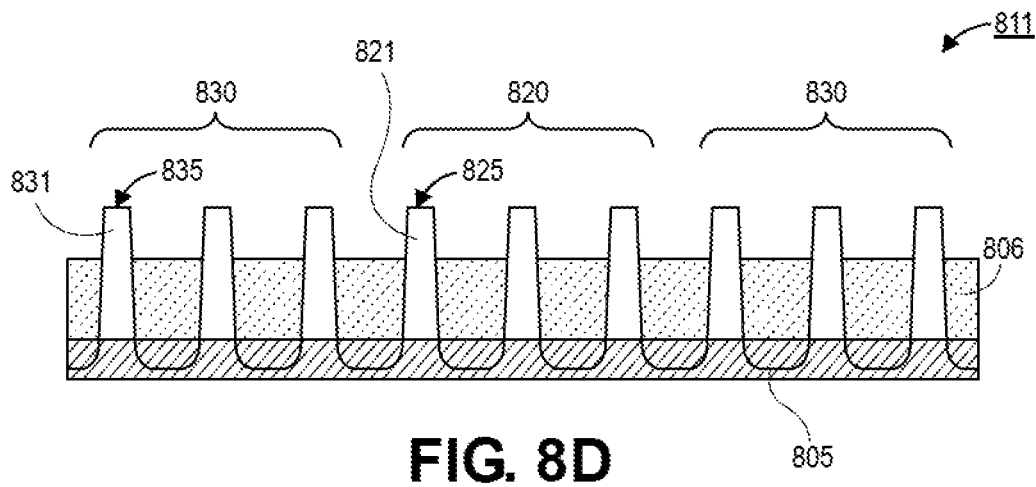
FIGS. 8D-8F are cross-sectional illustrations depicting a process for forming the RFT cell in FIGS. 8A-8C, in accordance with an embodiment.
Figure 8E:
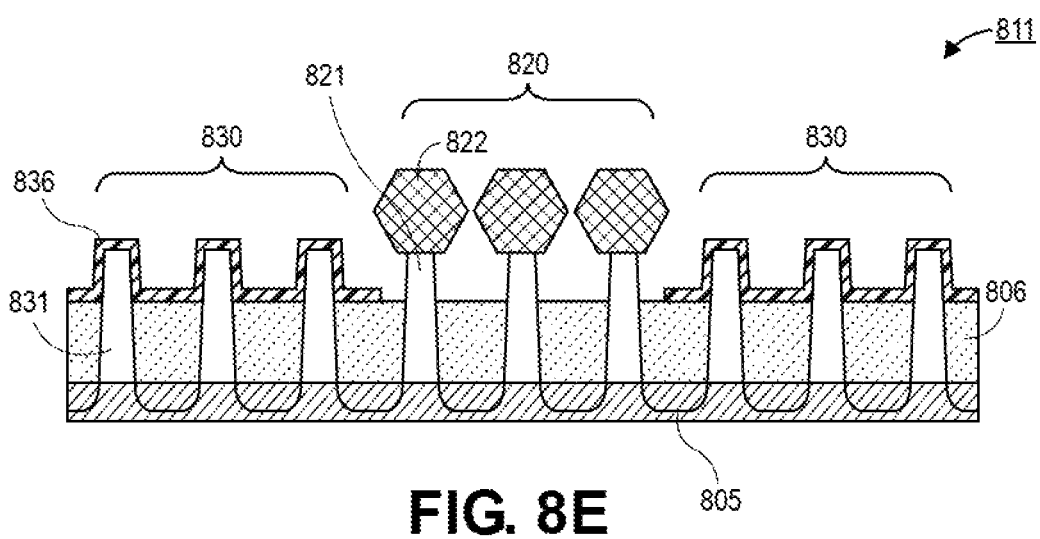
Figure 8F:
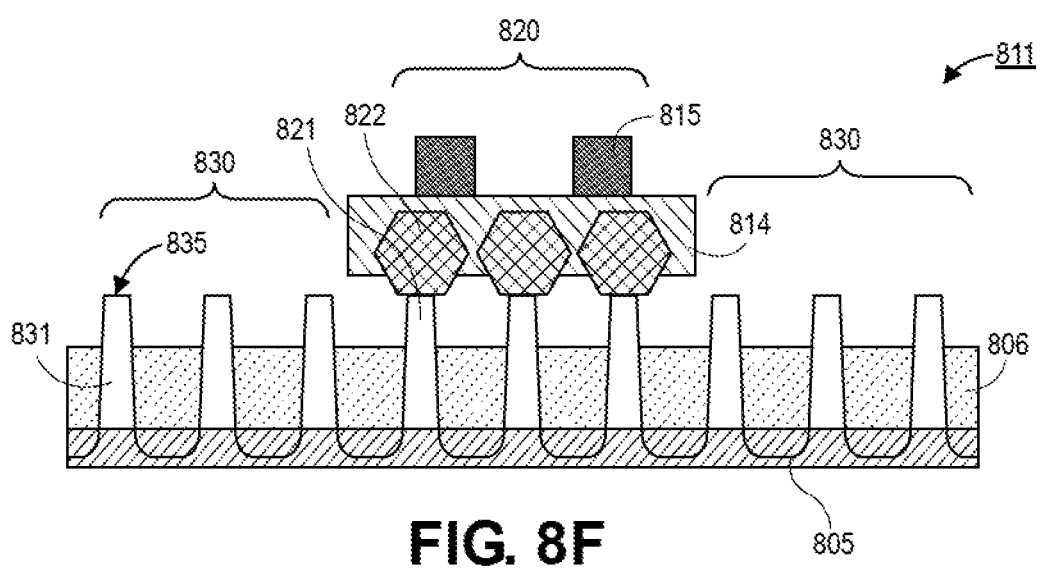

Referring now to FIGS. 8D-8F, a series of cross-sectional illustrations depicting a process for forming a cell 811 is shown, in accordance with an embodiment. Referring now to FIG. 8D, the skip fins 831 and the contact fins 821 are recessed. The recessing results in flat surfaces 825 over the contact fins 821 and flat surfaces 835 over the skip fins 831.

Referring now to FIG. 8E, a cross-sectional illustration after the epitaxial tips 822 are grown is shown, in accordance with an embodiment. In an embodiment, the skip fins 831 may be covered by a mask layer 836 that prevents the epitaxial growth. For example, the mask layer 836 may be an oxide, a nitride, or the like.

Referring now to FIG. 8F, a cross-sectional illustration after the mask layer 836 is stripped and the contact 814 and vias 815 are formed is shown, in accordance with an embodiment. In an embodiment, the mask layer 836 may be removed with any suitable process. The contact 814 and vias 815 may be formed with standard semiconductor processing operations.

Referring now to FIGS. 9A-9D, a series of illustrations depicting an RFT cell 911 is shown, in accordance with an additional embodiment. FIG. 9A is a plan view illustration of the cell 911. FIG. 9B is a cross-sectional illustration of the cell 911 in FIG. 9A along line B-B'. FIG. 9C is a cross-sectional illustration of the cell 911 in FIG. 9A along line C-C'. FIG. 9D is a cross-sectional illustration of the cell 911 in FIG. 9A along line D-D'.

The cell 911 comprises a set of contact fins 920 and sets of skip fins 930. In an embodiment, the contact fins 921 in the set of contact fins 920 are contacted by a pair of contacts 914 (with vias 915). The contacts 914 are outside a first gate electrode $912_A$ and a second gate electrode $912_B$, through which the contact fins 921 pass. As shown in FIG. 9B, an epitaxial tip 922 may be grown over portions of the contact fins 921 outside of the first gate electrode $912_A$ and the second gate electrode $912_B$. Within the gate electrodes $912_{A-B}$ (as shown in FIG. 9C) and between the gate electrodes $912_{A-B}$ (as shown in FIG. 9D) the contact fins 921 may be without the epitaxial tip 922. It is to be appreciated that other material layers between the gate electrodes $912_{A-B}$ and the fins 921/931 are omitted for simplicity. For example, gate dielectric layers, workfunction metal layers, and the like may also be included in the regions of the gate electrodes $912_{A-B}$.

As shown, two gate electrodes 912 are provided between the contacts 914. This allows for relaxation of design rules requirements. However, it is to be appreciated that embodiments may allow for any number of gate electrodes 912 between the contacts 914. Additional embodiments may also allow for a repeating pattern, such as including three or more contacts with every second contact skipped.

As shown, the skip fins 931 have a non-uniform height across their length. Within the gate electrodes 912$_{A-B}$ and between the gate electrodes 912$_{A-B}$, the skip fins 931 may have a first height that substantially matches a height of the contact fins 921 within the gate electrodes 912$_{A-B}$. Outside of the gate electrodes 912$_{A-B}$, the skip fins 931 may have a second height that is smaller than a height of the contact fins 921 outside of the gate electrodes 912$_{A-B}$. For example, outside of the gate electrode 912, the skip fins 931 may be referred to as fin stumps 933. The second height of the fin stumps 933 may be smaller than a height of an insulating layer 906. In some embodiments, the fin stumps 933 may be completely removed, so that there is substantially no remnant of the skip fin 931 outside of the gate electrodes 912$_{A-B}$. Accordingly, there are no skip fins 931 immediately adjacent to the contact 914 or the contact fins 921 outside of the gate electrodes 912$_{A-B}$. As such, the possibility of shorting to the skip fins 931 is eliminated while still maintaining the skip fins 931 within the gate electrodes 912$_{A-B}$.

In an embodiment, the OD region 905 defines the locations where fins 921/931 are reduced in height. For example, the OD region 905 surrounds the entire set of contact fins 920, encompasses the gate electrodes 912$_{A-B}$, and the region between the gate electrodes 912$_{A-B}$. In an embodiment, the OD region 905 extends out from the gate electrode 912. That is, some portion of the skip fins 931 immediately adjacent to the outer surfaces of the gate electrodes 912$_{A-B}$ may have the same height as the contact fins 921.

Referring now to FIGS. 10A-10C, a series of cross-sectional illustrations of RFTs 1000 is shown, in accordance with various embodiments. In each of FIGS. 10A-10C, a pair of cells 1011$_A$ and 1011$_B$ are shown. Additionally, a set of dummy fins 1048 are provided between the pair of cells 1011$_A$ and 1011$_B$. The set of dummy fins 1048 may comprise any number of dummy fins 1047. For example, FIG. 10A includes three dummy fins 1047, FIG. 10B includes two dummy fins 1047, and FIG. 10C includes four dummy fins 1047. In an embodiment, the dummy fins 1047 may also comprise an epitaxial tip 1049.

In an embodiment, the cells 1011$_{A-B}$ may comprise contact fins 1021 that are connected together by a contact 1014. The contact fins 1021 may also comprise an epitaxial tip 1022. Vias 1015 may be over the contact 1014. The OD region 1005 may be isolated over the contact fins 1021 and the dummy fins 1047. As such, the skip fins are recessed to form fin stumps 1033 in order to preventing shorting the contacts 1014 to the skip fins. However, the skip fins have a uniform shape with the contact fins 1021 across the gate electrode (not shown).

In FIGS. 1A-10C, RFT structures are disclosed. However, it is to be appreciate that embodiments are not limited to RFT structures. Particularly, embodiments may also use gate all-around (GAA) structures, such as nanowire and nanosheet structures, in order to provide a resonator. A nanowire may refer to a structure that has a width and thickness that are substantially uniform, and a nanosheet structure may refer to a structure that has a width and thickness that are not substantially uniform. As used herein, references to "nanowires" may also be considered to include "nanosheets". Particularly, the operation and fabrication of resonant nanowire transistors (RNWT) are similar to the operation and fabrication of resonant nanosheet transistors (RNST).

In RFT structures, the resonant mode observed in each channel is substantially uniform, and the pressure profile changes sign at every other fin. In contrast, RNWT do not have a uniform pressure profile within the nanowires formed from a single fin. Particularly, the pressure inside vertically stacked nanowires fabricated from the same fin stem exhibit opposite signs of pressure. This alternating sign from one nanowire to the next in the vertical direction requires a different interconnect architecture in order for the resonator to properly function. Accordingly, embodiments disclosed herein include interconnect architectures that allow for phase matching individual nanowires between fin stems.

Figure 11A:
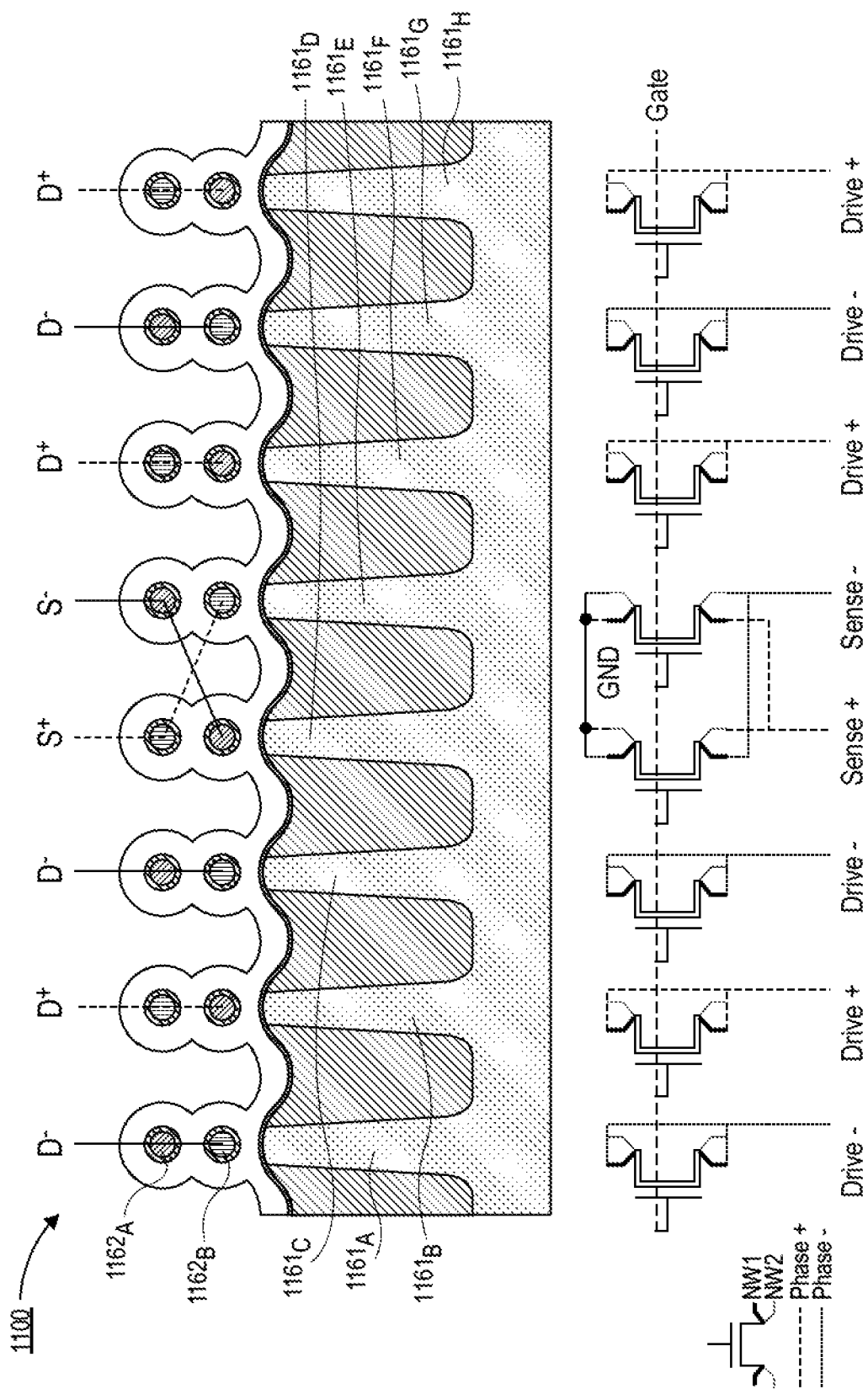
FIGS. 11A and 11B are illustrations and circuit diagrams that depict how a resonant nanowire transistor (RNWT) is electrically connected in accordance with different embodiments.

Referring now to FIG. 11A, a cross-sectional illustration and corresponding circuit diagram of a RNWT 1100 is shown, in accordance with an embodiment. As shown, RNWT 1100 includes a plurality of fin stems 1161$_{A-H}$. Above each fin stem 1161 a pair of nanowires 1162$_A$ (top nanowire) and 1162$_B$ (bottom nanowire) are provided. The different shading of the nanowires 1162$_A$ and 1162$_B$ indicate the different pressure signs. Alternating fin stems 1161 also exhibit a rotation of the pressure signs. For example, in fin stem 1161$_D$ nanowire 1162$_A$ is positive and nanowire 1162$_B$ is negative, and in fin stem 1161$_E$ nanowire 1162$_A$ is negative and nanowire 1162$_B$ is positive.

Fin stems 1161$_{A-C}$ and 1161$_{F-H}$ are drive fins, and fin stems 1161$_{D-E}$ are sense stems. The drive fins are contacted as MOScaps which excite the mechanical mode inside the common gate of the device. The common gate can span over 100's of adjacent fin stems in some embodiments. The mechanical wave is probed with the sense stems which is formed from a differential pair of transistors. For the drive stems 1161$_{A-C}$ and 1161$_{F-H}$, a single voltage is provided. Particularly, as shown in the circuit diagram, the source and drains of each fin stem 1161 are shorted together.

Fin stems 1161$_{D-E}$ are phase-matched. For example, voltage S$^+$ is applied to the nanowire 1162$_A$ in fin stem 1161$_D$ and to nanowire 1162$_B$ in fin stem 1161$_E$, and voltage S$^-$ is applied to nanowire 1162$_A$ in fin stem 1161$_E$ and to nanowire 1162$_B$ in fin stem 1161$_D$. As shown in the circuit diagram, the cross coupling is provided on the drain side, and the source side of the fin stems 1161$_{D-E}$ are grounded. In other embodiments, the source side includes the cross coupling, and the drain side is grounded. Such an embodiment may then utilize a negative voltage to provide the necessary functionality. As shown in the circuit diagram, the gate electrodes for all fin stems 1161$_{A-H}$ are coupled to a single gate voltage.

Such phase matching of the sense fin stems 1161$_{D-E}$ provides improved transconductance. For example, the transconductance obtained using the phase matched sensing may be approximately 250 times higher compared to a connection scheme of the sense fin stems 1161$_{D-E}$ without phase matching. Embodiments may also include more than two sense fin stems 1161 that are connected using phase matching schemes. In such instances the modulated current can be increased even further.

Figure 11B:
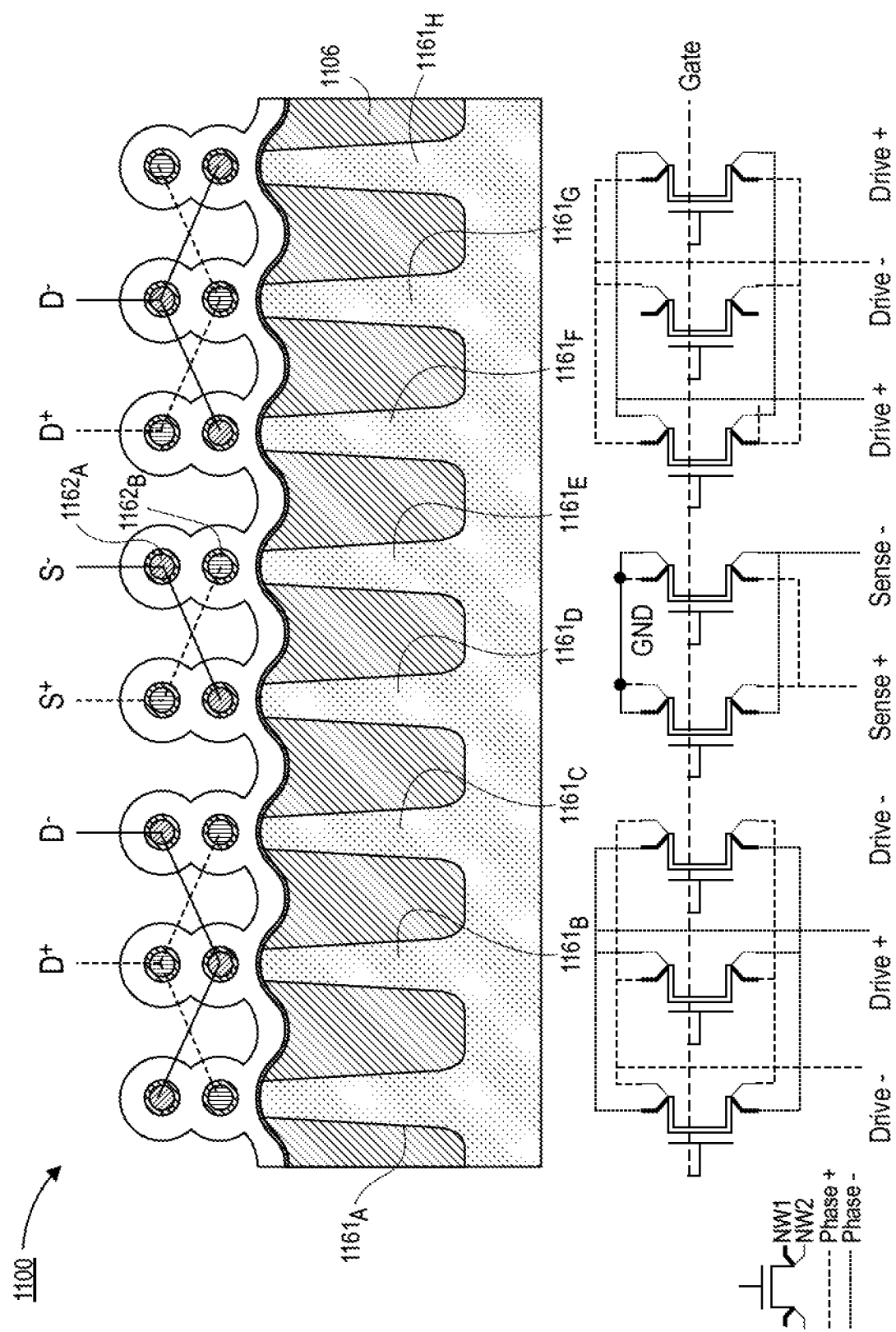

Referring now to FIG. 11B, a cross-sectional illustration and circuit diagram are provided in accordance with an additional embodiment. In FIG. 11B, both the drive fin stems 1161$_{A-C}$ and 1161$_{F-H}$ and the sense fin stems 1161$_{D-E}$ are phase matched. For example, the nanowire 1162$_A$ of fin stem 1161$_A$, the nanowire 1162$_B$ of fin stem 1161$_B$, and the nanowire 1162$_A$ of fin stem 1161$_C$ are connected together, and the nanowire 1162$_B$ of fin stem 1161$_A$, the nanowire 1162$_A$ of fin stem 1161$_B$, and the nanowire 1162$_B$ of fin stem 1161$_C$ are connected together. Similarly, the nanowire 1162$_A$ of fin stem 1161$_F$, the nanowire 1162$_B$ of fin stem 1161$_G$, and the nanowire 1162$_A$ of fin stem 1161$_H$ are connected together, and the nanowire 1162$_B$ of fin stem 1161$_F$, the nanowire 1162$_A$ of fin stem 1161$_G$, and the nanowire 1162$_B$ of fin stem 1161$_H$ are connected together. The phase matching of the sense fin stems $1161_{D-E}$ in FIG. 11B is similar to the phase matching of the sense fin stems $1161_{D-E}$ in FIG. 11A.

Referring now to FIGS. 12A-12J, a process for forming individual interconnects to each nanowire stack is shown, in accordance with an embodiment. The ability to individually connect nanowires within a stack allows for the phase matching interconnect architectures utilized in RNWT structures described above.

Figure 12A:
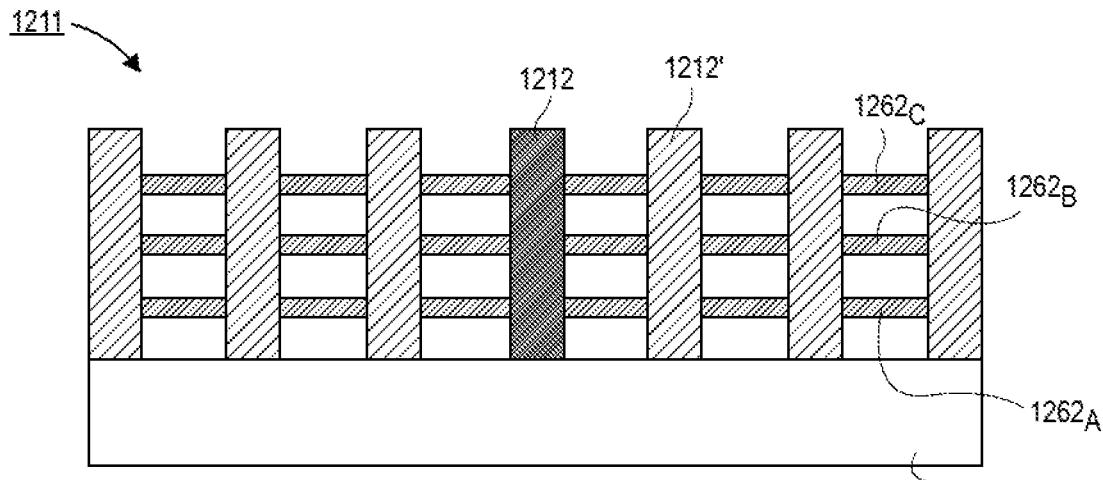
FIGS. 12A-12J are cross-sectional illustrations depicting a process for forming a RNWT, in accordance with an embodiment.

Referring now to FIG. 12A, a cross-sectional illustration of a portion of a RNWT cell 1211 is shown, in accordance with an embodiment. In an embodiment, the cell 1211 comprises a substrate 1202 (which may comprise a fin stem) and a plurality of nanowires $1262_{A-C}$ above the substrate 1202. A gate electrode 1212 may be centered over the nanowires 1262. Additional dummy gates 1212' are disposed over the nanowires $1262_{A-C}$. In the illustrated embodiment, three nanowires $1262_{A-C}$ are shown. However, it is to be appreciated that any number of nanowires 1262 may be stacked in accordance with various embodiments.

Figure 12B:
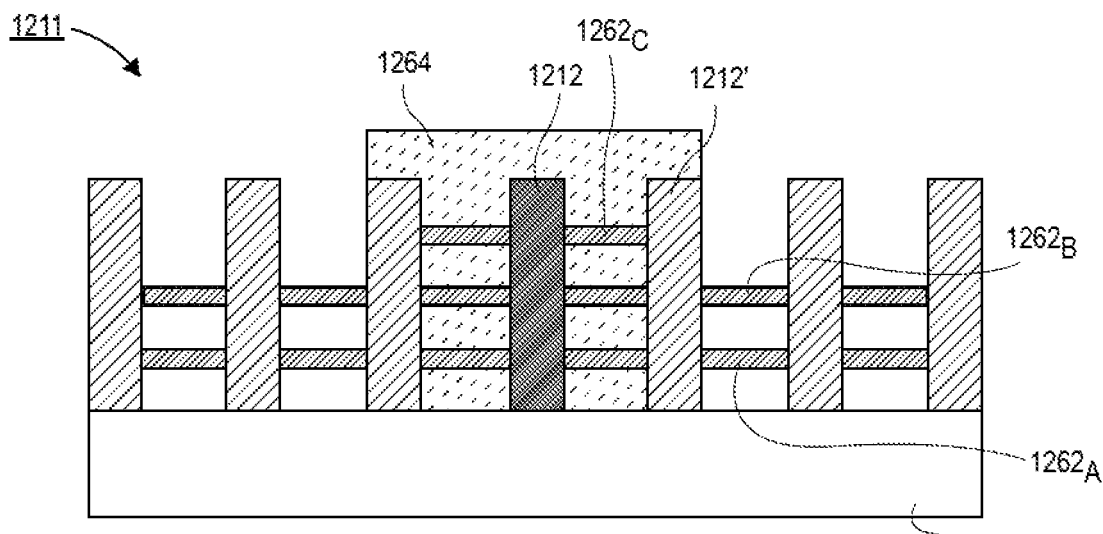

Referring now to FIG. 12B, a cross-sectional illustration of the cell 1211 after portions of the third nanowire $1262_C$ are removed is shown, in accordance with an embodiment. In an embodiment, a mask layer 1264 may cover the portions of the nanowires $1262_{A-C}$ immediately adjacent to the gate electrode 1212. An etching process may then be used to remove the exposed portions of the third nanowire $1262_C$ outside of the mask layer 1264.

Figure 12C:
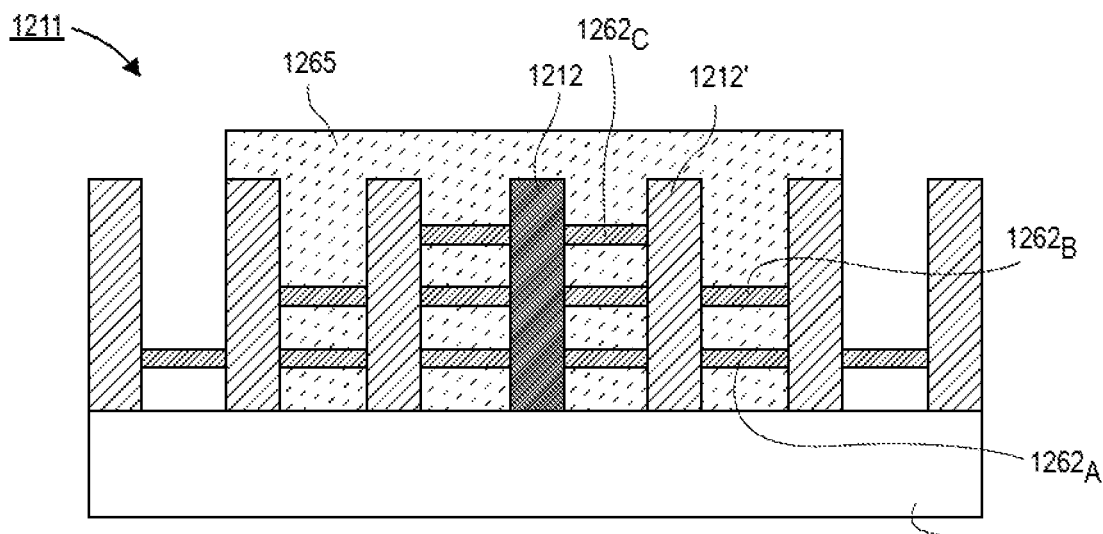

Referring now to FIG. 12C, a cross-sectional illustration of the cell 1211 after portions of the second nanowire $1262_B$ are removed is shown, in accordance with an embodiment. In an embodiment, a mask layer 1265 may cover the nanowires $1262_{A-C}$ adjacent to the gate electrode 1212 and out to the second dummy gates 1212' away from the gate electrode 1212. An etching process may then be used to remove the exposed portions of the second nanowire $1262_B$.

Figure 12D:
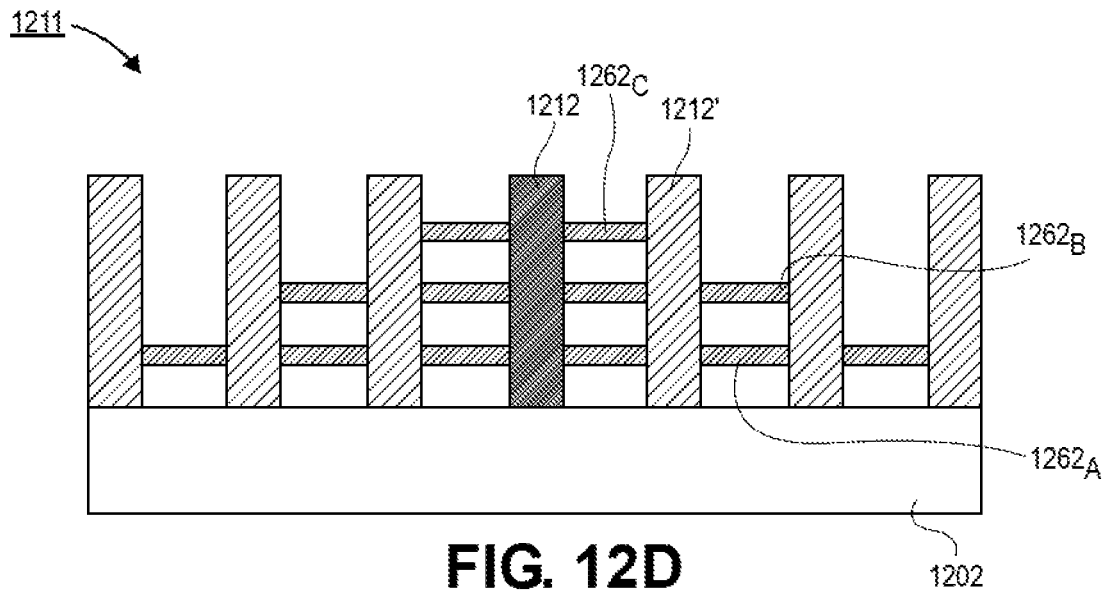

Referring now to FIG. 12D, a cross-sectional illustration of the cell 1211 after the mask layer 1265 is removed is shown, in accordance with an embodiment. As shown, each of the nanowires $1262_{A-C}$ now are exposed from above in order to make the individual contacts.

Figure 12E:
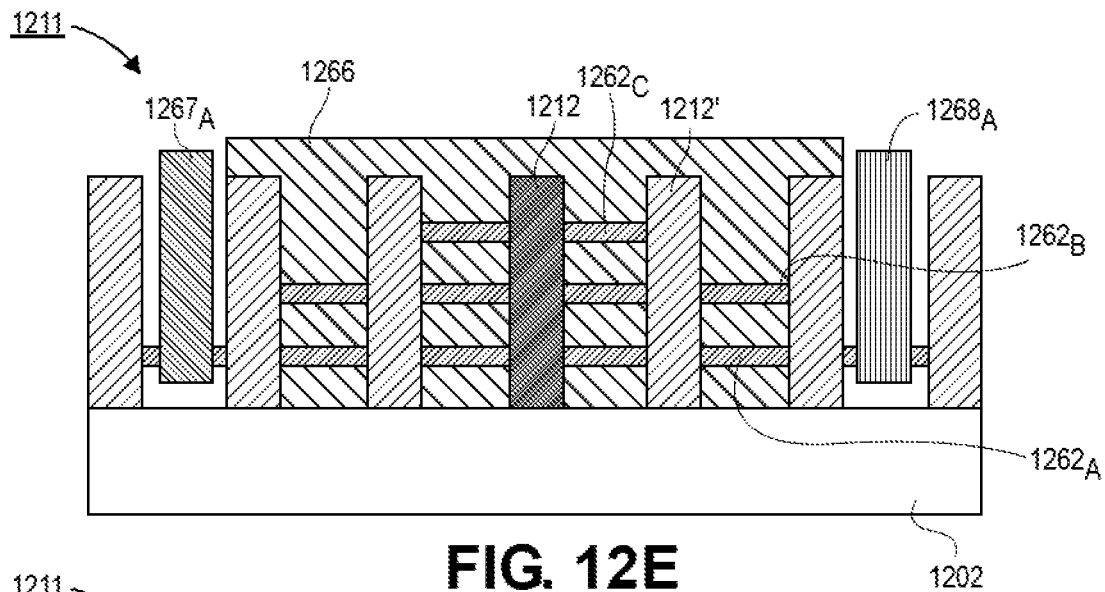

Referring now to FIG. 12E, a cross-sectional illustration of the cell 1211 after a first source contact $1267_A$ and a first drain contact $1268_A$ are made to the first nanowire $1262_A$. In an embodiment, a mask layer 1266 may cover the second nanowire $1262_B$ and the third nanowire $1262_C$ during the formation of the first source contact $1267_A$ and the first drain contact $1268_A$.

Figure 12F:
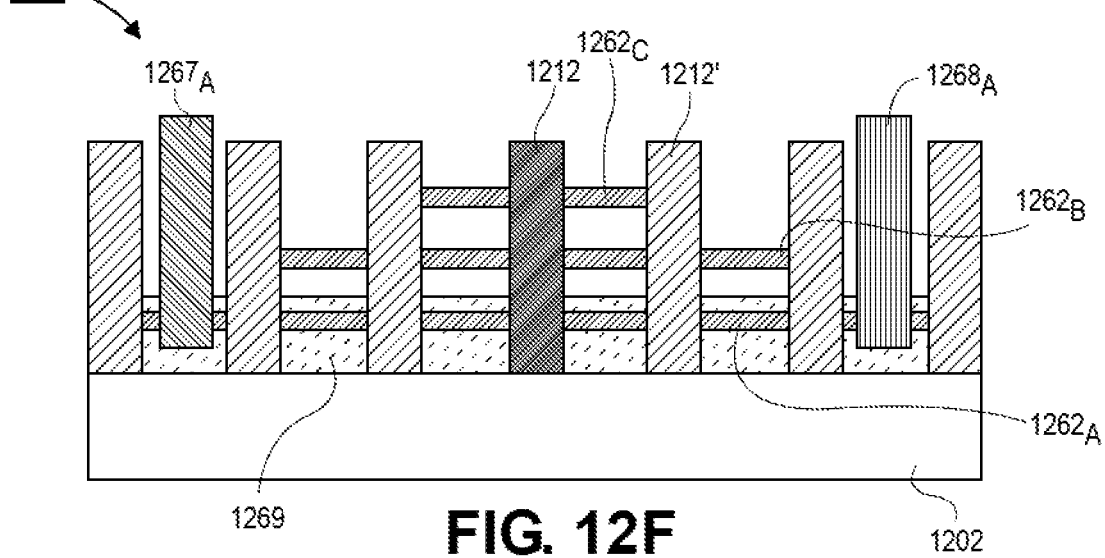

Referring now to FIG. 12F, a cross-sectional illustration of the cell 1211 after the mask layer 1266 is removed and an insulating layer 1269 is disposed over the first nanowire $1262_A$ is shown, in accordance with an embodiment.

Figure 12G:
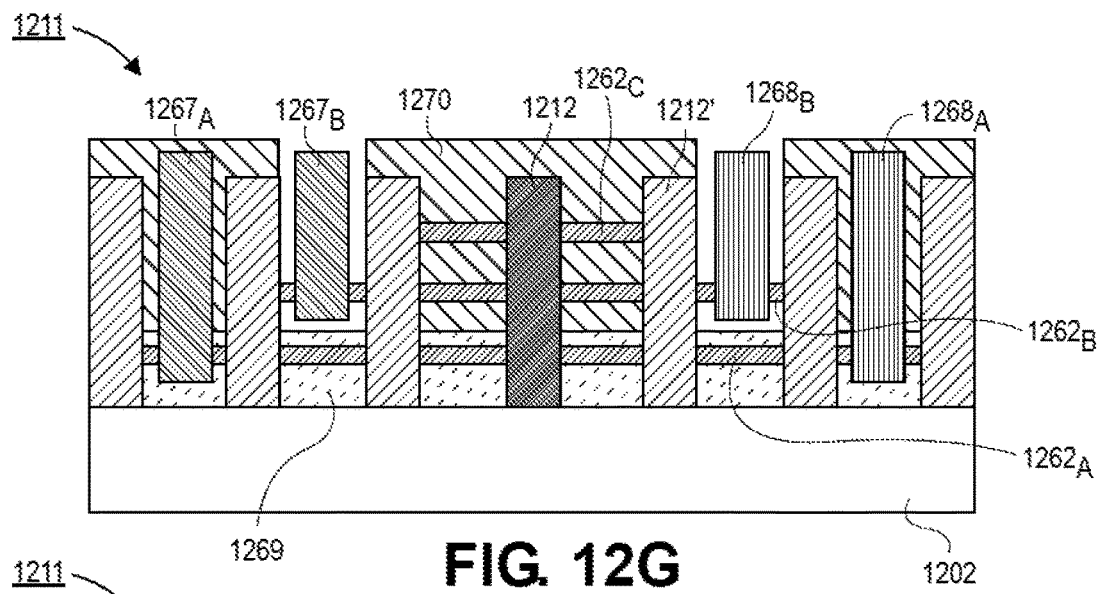

Referring now to FIG. 12G, a cross-sectional illustration of the cell 1211 after a second source contact $1267_B$ and a second drain contact $1268_B$ are formed over the second nanowire $1262_B$ is shown, in accordance with an embodiment. In an embodiment, a mask layer 1270 is disposed over the first source contact $1267_A$, the first drain contact $1268_A$, and the third nanowire $1262_C$ before forming the second source contact $1267_B$ and the second drain contact $1268_B$.

Figure 12H:
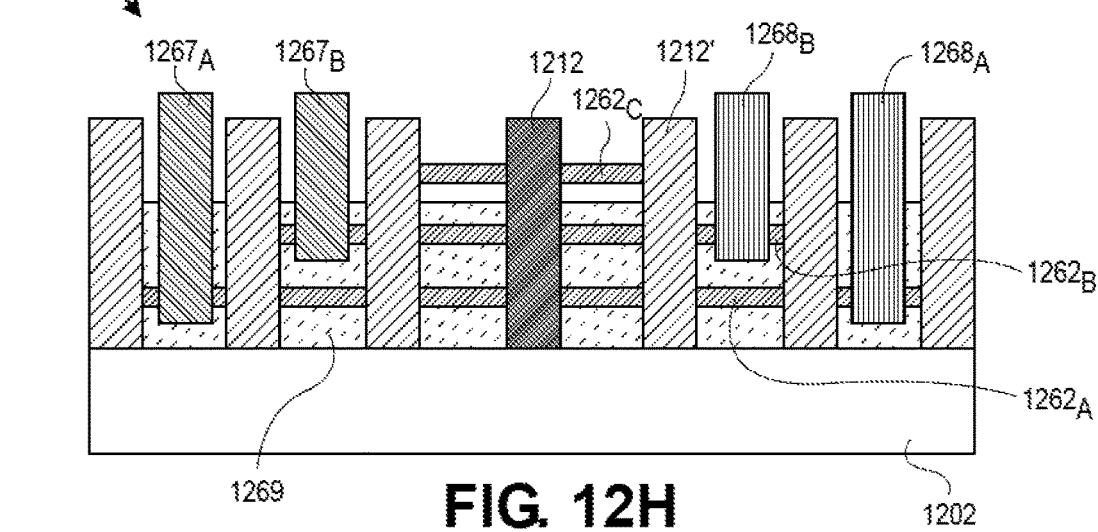

Referring now to FIG. 12H, a cross-sectional illustration of the cell 1211 after the mask layer 1270 is removed and insulating layer 1269 is disposed over the second nanowire $1262_B$ is shown, in accordance with an embodiment.

Figure 12I:
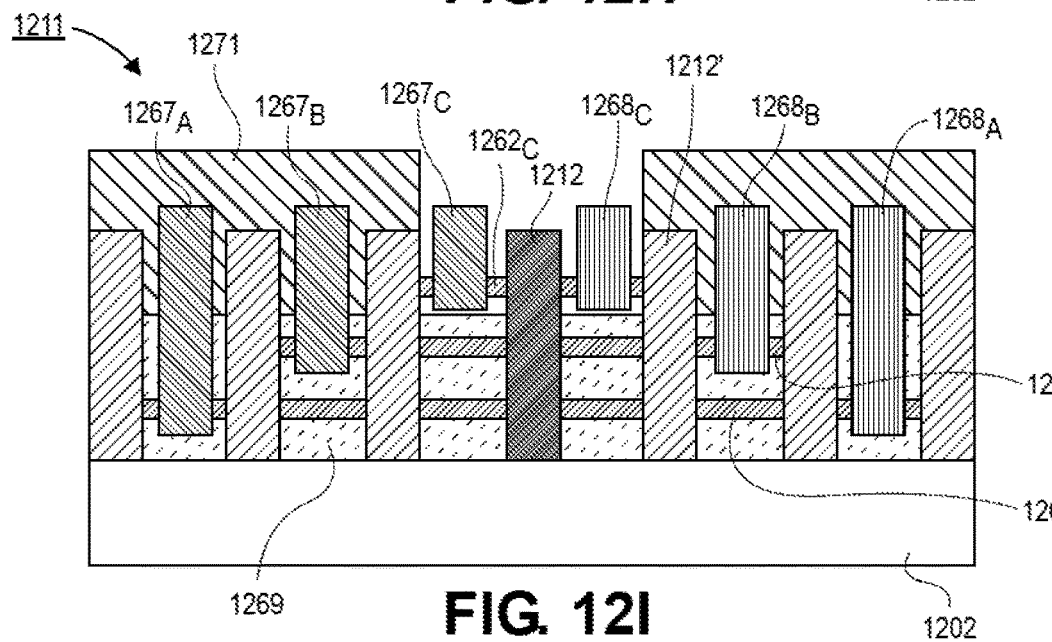

Referring now to FIG. 12I, a cross-sectional illustration of the cell 1211 after a third source contact $1267_C$ and a third drain contact $1268_C$ are formed over the third nanowire $1262_C$ is shown, in accordance with an embodiment. In an embodiment, a mask layer 1271 is disposed over the first source contact $1267_A$, the first drain contact $1268_A$, the second source contact $1267_B$, and the second drain contact $1268_B$ before forming the third source contact $1267_C$ and the third drain contact $1268_C$.

Figure 12J:
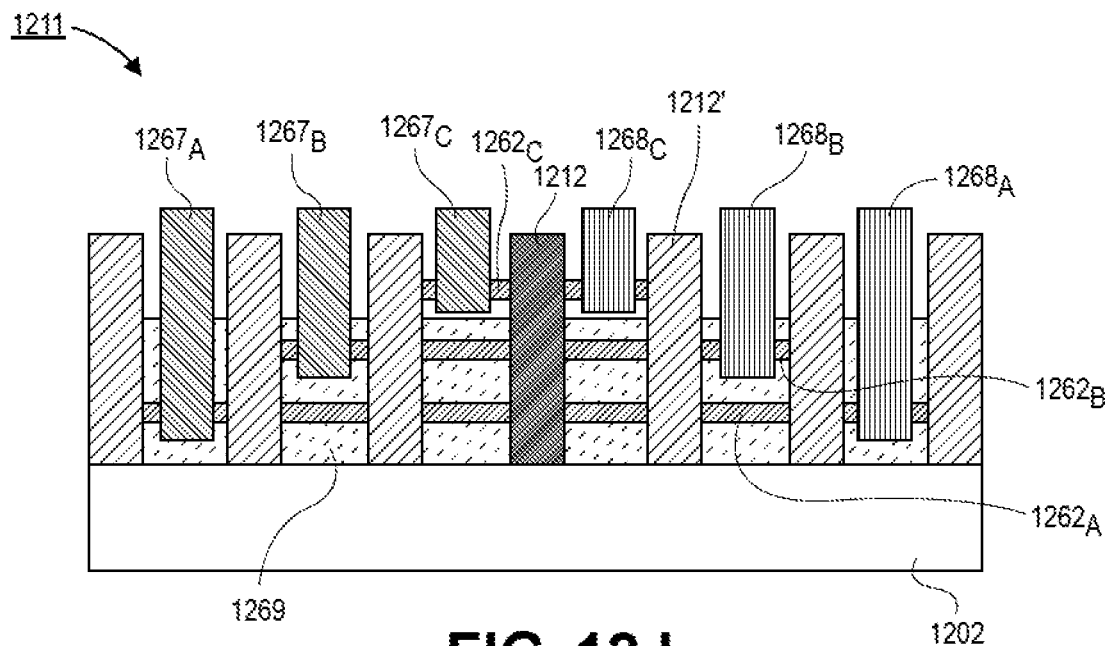

Referring now to FIG. 12J, a cross-sectional illustration of the cell 1211 after the mask layer 1271 is removed is shown, in accordance with an embodiment. As shown, each nanowire $1262_{A-C}$ in the stack may be individually addressable.

Figure 13:
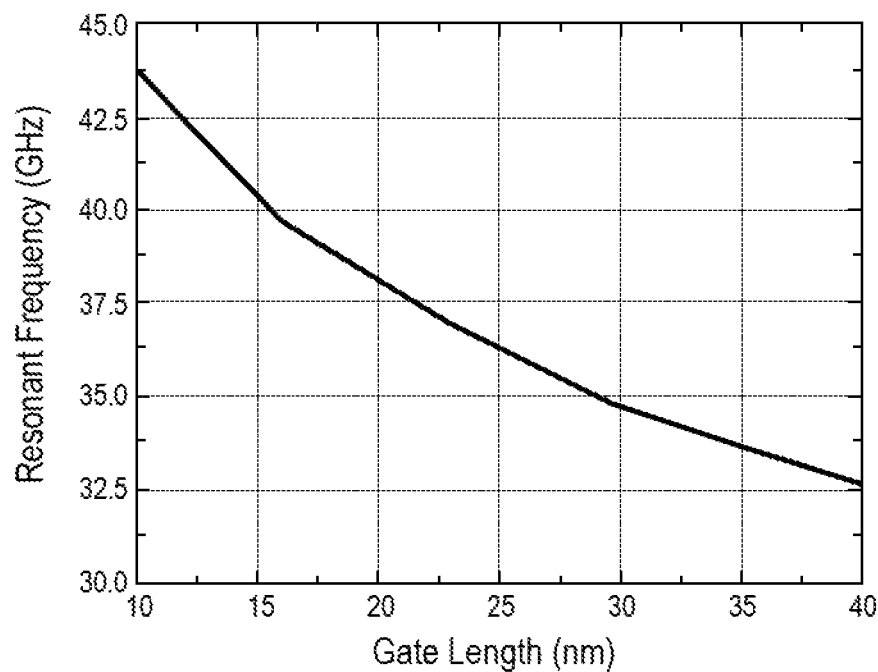
FIG. 13 is a graph depicting the change in resonant frequency of a RFT with respect to gate length, in accordance with an embodiment.

Embodiments disclosed herein may also allow for the frequency tuning of the RFTs or RNWTs. Particularly, as shown in FIG. 13, the resonant frequency of such structures are at least partially dependent on the gate length. As shown in the graph, shorter gate lengths provide a higher resonant frequency. Accordingly, embodiments disclosed herein allow for the frequency of the RFT or RNWT device to be tuned to the requirements of the applications. Embodiments may also allow for the integration of a set of RFT or RNWT devices with different frequencies. By switching between the different frequencies it is possible to compensate for variations or to introduce a frequency modulation.

In addition to frequency tuning through gate length modulation, the resonant frequency of RFT and RNWT devices may be tuned by altering the materials and dimensions of the gate stack. However, the gate thickness is generally fixed to the highest performing value from a classic transistor point of view. The gate thickness affects gate resistance and gate capacitance, which strongly influence digital and analog/RF performance of the transistor. Therefore, this parameter is optimized by these boundary condition. Most commonly all gates are fabricated in one process step at once, where a direct change of the gate thickness is most likely not easy to accomplish as it might have a negative effect on all other non-RFT devices. Nevertheless, one can tune the gates of RFT and RNWT structures by introducing an additional tuning layer on top of the individual gates which allows the selective tuning of certain structures. This can be accomplished by additional masks during fabrication, after all gates have been fabricated. An example of such a tuning layer is shown in FIGS. 14A-14E.

Figure 14A:
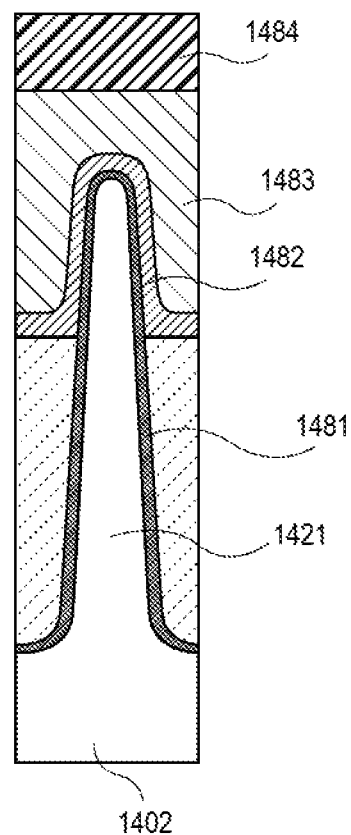
FIGS. 14A-14E are cross-sectional illustrations of RFTs with a tuning layer disposed over the gate electrode, in accordance with an embodiment.

Referring now to FIG. 14A, a cross-sectional illustration of a single fin 1421 within the gate electrode of an RFT is shown, in accordance with an embodiment. The fin 1421 may extend up from a substrate 1402. In an embodiment, the fin 1421 may be lined with a gate dielectric 1481. A workfunction metal 1482 may be over the gate dielectric 1481, and a gate fill metal 1483 may be over the workfunction metal 1482. A tuning layer 1484 may be disposed over the workfunction metal 1483.

In an embodiment, the gate dielectric 1481 may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

When the workfunction metal 1482 is an N-type workfunction material, the workfunction metal 1482 preferably has a workfunction that is between about 3.9 eV and about 4.2 eV. N-type materials that may be used to form the workfunction metal 1482 include, but are not limited to, hafnium, zirconium, titanium, tantalum, aluminum, and metal carbides that include these elements, i.e., titanium carbide, zirconium carbide, tantalum carbide, hafnium carbide and aluminum carbide. When the workfunction metal 1482 is a P-type workfunction metal, the workfunction metal 1482 preferable has a workfunction that is between about 4.9 eV and about 5.2 eV. P-type materials that may be used to form the workfunction metal 1482 include, but are not limited to, ruthenium, palladium, platinum, cobalt, nickel, and conductive metal oxides, e.g., ruthenium oxide. In an embodiment, the gate fill metal 1483 may comprise a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example.

In an embodiment, the thickness and material choice for the tuning layer 1484 allows for frequency modulation. Particularly, a higher density of the tuning layer 1484 leads to a lower resonant frequency whereas an increased young's modulus of the tuning layer 1484 yields a higher resonant frequency. Therefore one can specifically tune the frequency by choosing an appropriate material in addition to the optimal tuning layer thickness. The tuning layer 1484 may include a material that is typically used in semiconductor manufacturing environments. For example, the tuning layer 1484 may include, but is not limited to, Pt, W, Cu, NiSi, Ta, $SiO_2$, TiSi, TiN, Al, and polysilicon.

In addition to frequency modulation, the tuning layer 1484 may also be used for temperature stabilization. For example, a carefully chosen material with a very low temperature dependence can be used to reduce the temperature drift of an RFT or RNWT structure. Moreover a material with an inverse temperature behavior of the RFT cavity could possibly even prevent a shift in frequency due to temperature change.

Furthermore, it is to be appreciated that the tuning layer 1484 may not be a homogeneous layer. That is, a uniform tuning layer 1484 need not be disposed over each of the fins in an RFT structure. This patterning of the tuning layer can be used to e.g. prevent propagation of the mode over a certain location inside a gate or to create a super lattice mode which can be used for other applications. Moreover the frequency of the device can be tuned locally inside a cavity by applying the layer only at certain positions. Several examples, of such RFT structures 1400 are provided in FIGS. 14B-14E.

Figure 14B:
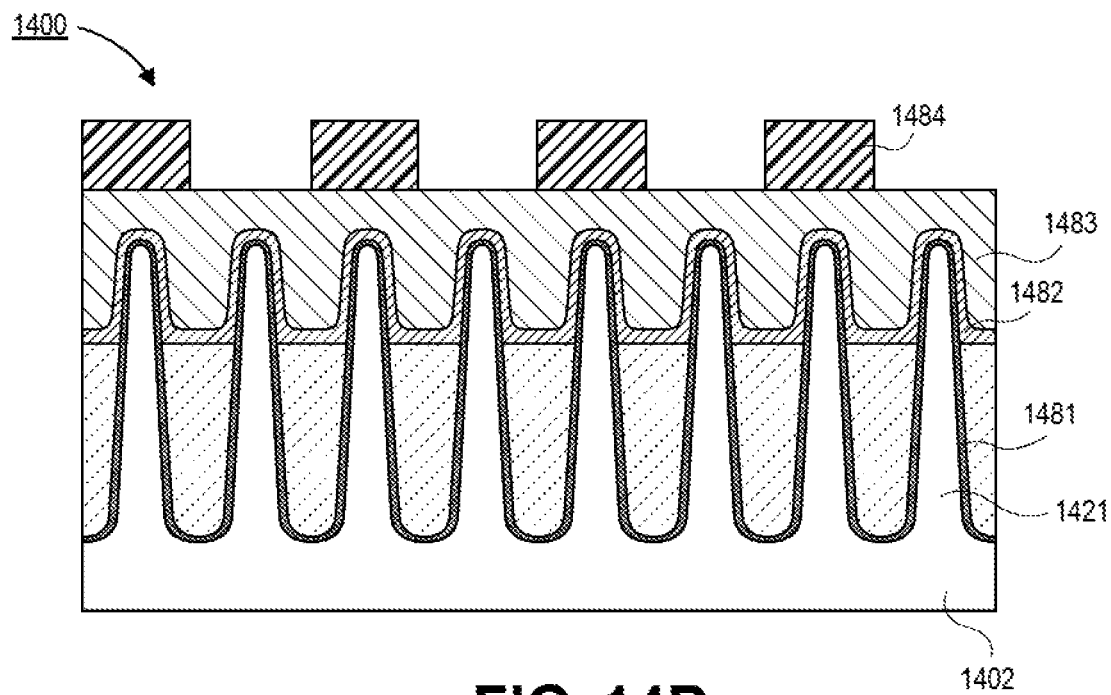

In FIG. 14B, an RFT structure 1400 with a tuning layer 1484 that is in a periodic pattern to match the fin pitch is provided, in accordance with an embodiment. As shown, tuning layer 1484 blocks have a width that is substantially matched to a width of the fins 1421, with every other fin 1421 covered by a tuning layer 1484 block.

Figure 14C:
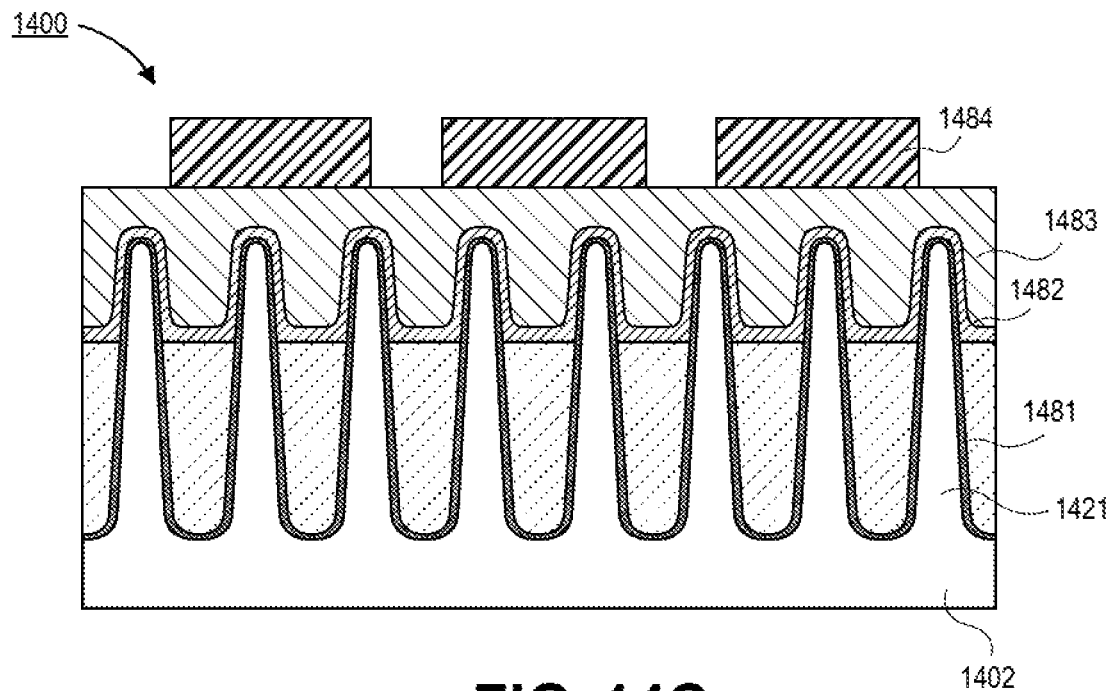

In FIG. 14C, an RFT structure 1400 with a tuning layer 1484 that is in a super periodic patter that is not matched to the fin pitch is provided, in accordance with an embodiment. As shown, tuning layer 1484 blocks with a width that is greater than a width of the fins 1421 is provided in a periodic pattern over the fins 1421.

Figure 14D:
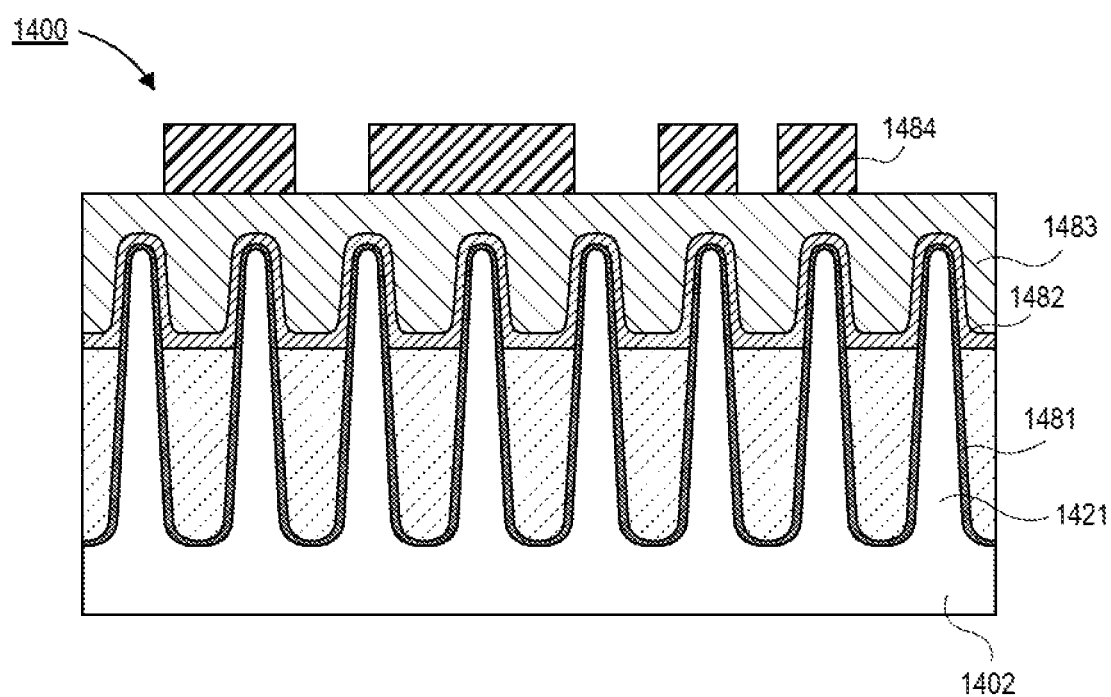

In FIG. 14D, an RFT structure 1400 with a tuning layer 1484 that is in a non-periodic arbitrary pattern is provided, in accordance with an embodiment. As shown, the tuning layer 1484 blocks may have a non-uniform width. Furthermore, the tuning layer 1484 blocks may have a non-uniform spacing.

Figure 14E:
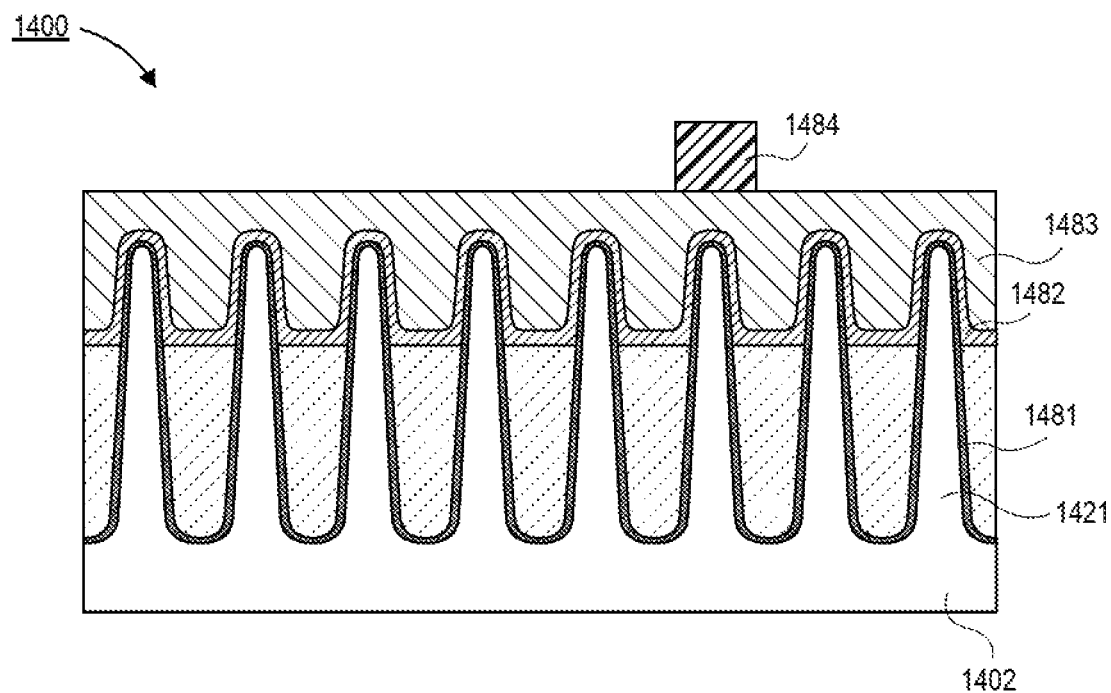

In FIG. 14E, an RFT structure 1400 with a tuning layer 1484 that is provided at certain locations is provided, in accordance with an embodiment. As shown, a single tuning layer 1484 block is placed over fins 1421. Accordingly, selective tuning of individual fins 1421 in the RFT structure 1400 is provided in some embodiments.

Figure 15:
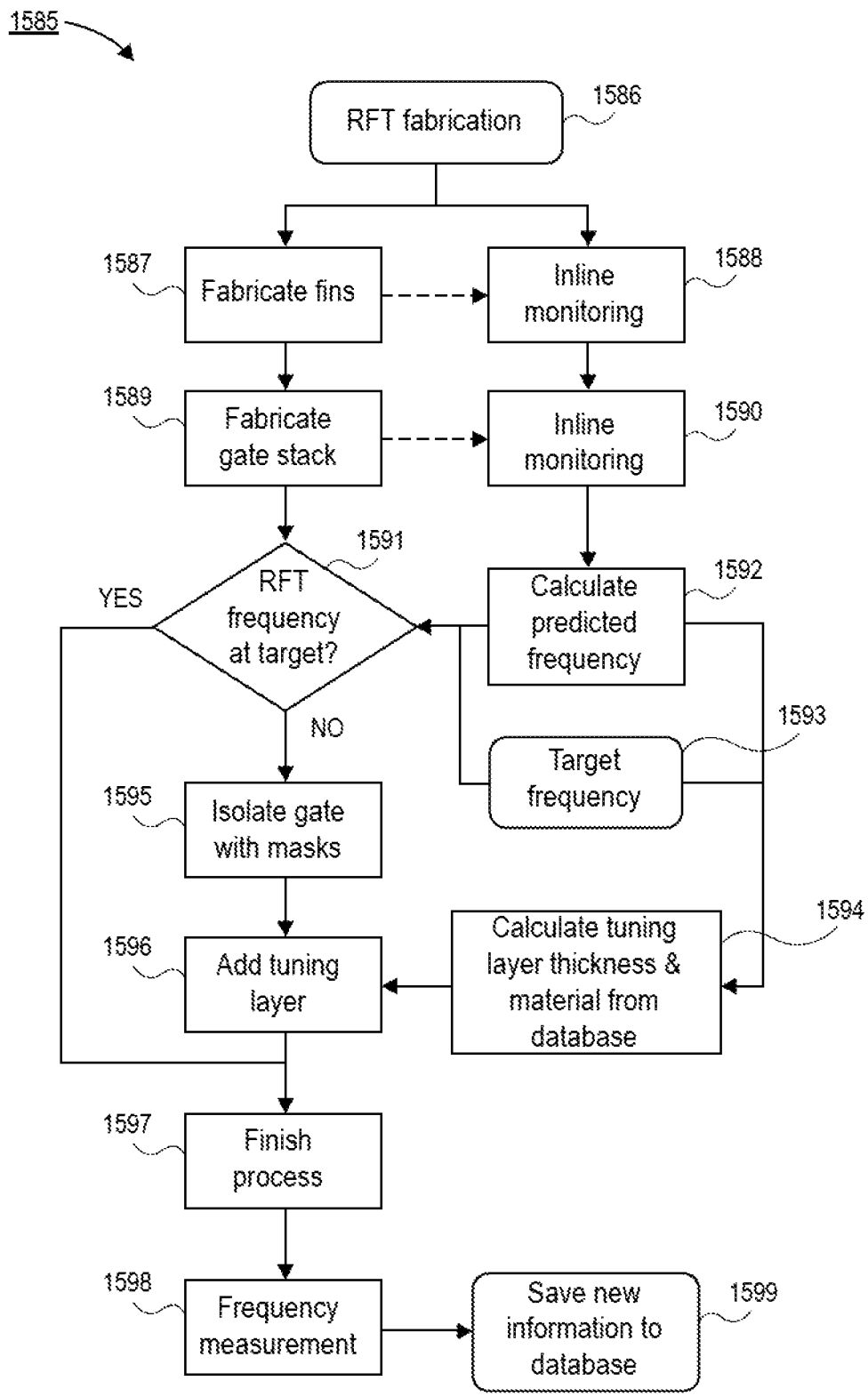
FIGS. 15 and 16 are process flow diagrams depicting different processes for implementing a tuning layer over the gate electrode of an RFT, in accordance with different embodiments.
Figure 16:
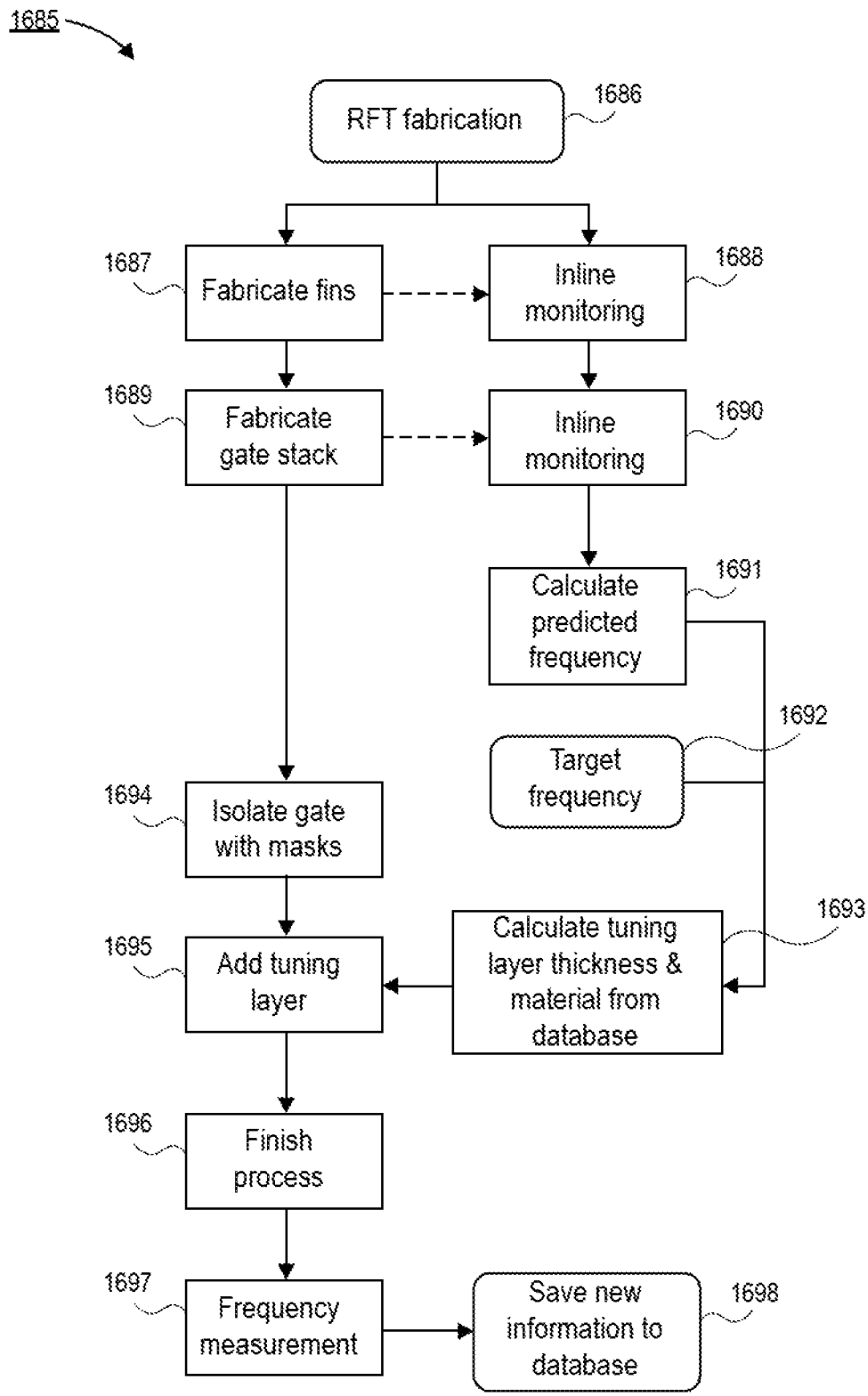

During Fabrication of the critical parts of the RFT device, namely the fins and the gate stack inline monitoring data can be used to detected uncalibrated devices. Therefore, an inline monitoring database may be created. The database contains the resonant frequency of the RFT (characterized after full wafer manufacturing) and also the related inline monitoring data, like critical dimensions or film thicknesses. With this database and assisting mechanical simulations, it is possible to predict the final frequency of the RFT (with some tolerance) during the manufacturing process. After the creation of the database it can be used for all subsequent manufactured devices. During fabrication the critical parameters are monitored and the frequency of the devices is predicted from the inline monitoring database. Therefore, it is possible to add an additional tuning layer, with an arbitrary thickness and material to individual gates, which shifts the RFT frequency back to the target value. FIGS. 15 and 16 provided exemplary process flows that include inline monitoring used to choose an appropriate tuning layer material, thickness, and/or pattern to shift the RFT frequency back to a target value.

Referring now to FIG. 15, a process 1585 for tuning a frequency of an RFT structure that does not meet the target frequency by choosing an appropriate tuning layer material and thickness is shown, in accordance with an embodiment. Process 1585 begins with RFT fabrication at block 1586. The RFT fabrication may comprise fabricating fins at block 1587. Inline monitoring at block 1588 is used to determine the dimensions of the fins. At block 1589, the gate stack is fabricated. Again, inline monitoring at block 1590 is used to determine the structure of the gate stack. After the fabrication of the fins and gate stack, the process queries whether an RFT frequency is at the target frequency at block 1591. The inline monitoring of blocks 1588 and 1590 allow for a predicted frequency to be calculated (e.g., through simulation and/or from a database) at block 1592. This is compared with the target frequency at block 1593. If the target frequency is not met, then the non-conforming gates may be isolated with a mask at block 1595. At block 1594, a tuning layer with a material and thickness to return the non-conforming gates back to the target frequency is calculated. The proper material and thickness may be obtained from a database and/or by simulation. At block 1596 the tuning layer is added to the non-conforming gates. At block 1597 the processing of the RFT is finished. At block 1598 a measurement of the frequency may be made. In some embodiments, the new information may be saved to the database for future use at block 1599.

Referring now to FIG. 16, a process 1685 for tuning the RFT structure to a desired target frequency independent of its inherent frequency is shown, in accordance with an embodiment. Process 1685 begins with RFT fabrication at block 1686. The RFT fabrication may comprise fabricating fins at block 1687. Inline monitoring at block 1688 is used to determine the dimensions of the fins. At block 1689, the gate stack is fabricated. Again, inline monitoring at block 1690 is used to determine the structure of the gate stack. The inline monitoring of blocks 1688 and 1690 allow for a predicted frequency to be calculated (e.g., through simulation and/or from a database) at block 1691. This is compared with the target frequency at block 1692. At block 1693, a tuning layer with a material and thickness to shift the gates to the target frequency is calculated. The proper material and thickness may be obtained from a database and/or by simulation. In an embodiment, gates may be isolated with a mask at block 1694. At block 1695 the tuning layer is added to the gates. At block 1696 the processing of the RFT is finished. At block 1697 a measurement of the frequency may be made. In some embodiments, the new information may be saved to the database for future use at block 1698.

Figure 17:
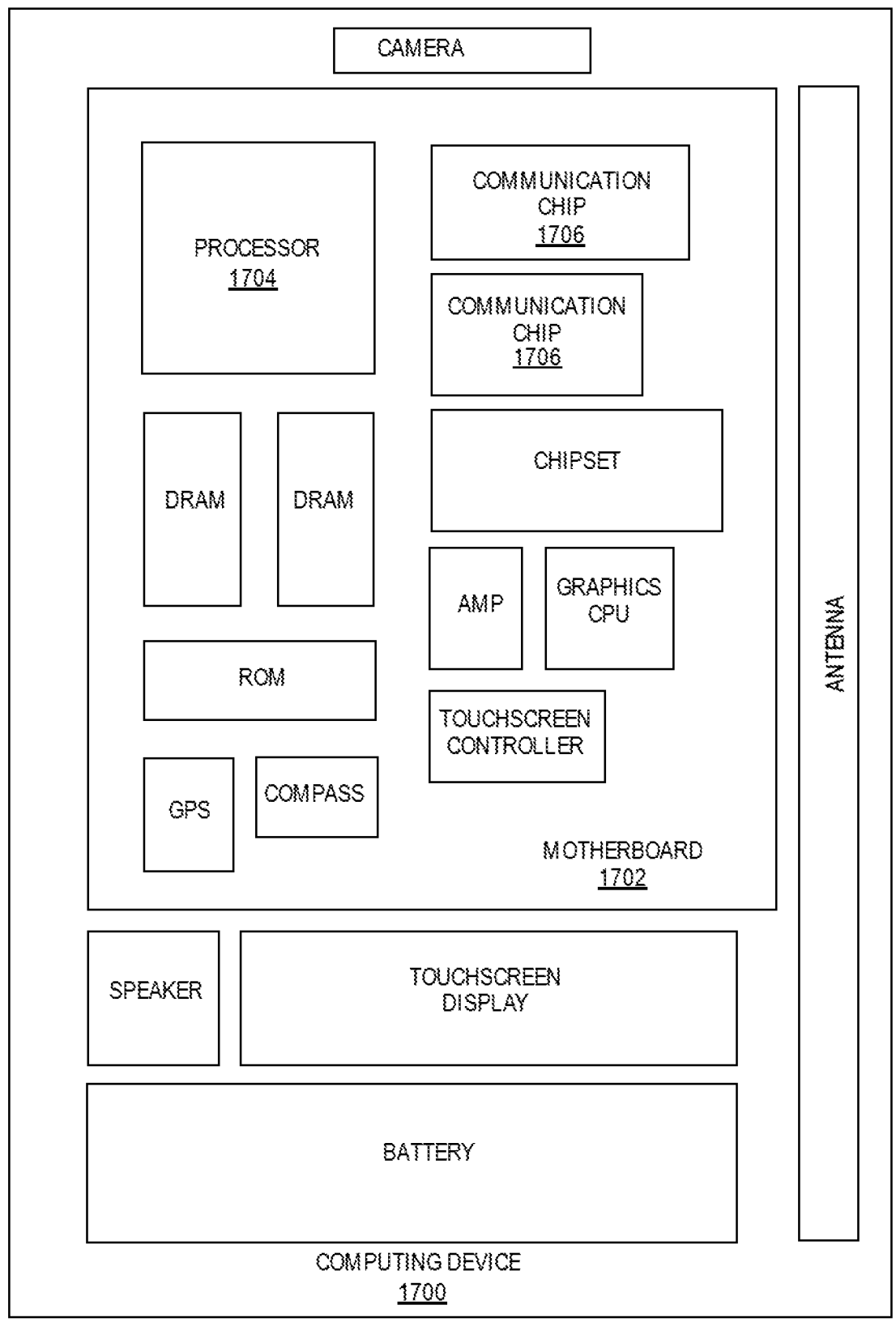
FIG. 17 illustrates a computing device in accordance with one implementation of an embodiment of the disclosure.

FIG. 17 illustrates a computing device 1700 in accordance with one implementation of an embodiment of the disclosure. The computing device 1700 houses a board 1702. The board 1702 may include a number of components, including but not limited to a processor 1704 and at least one communication chip 1706. The processor 1704 is physically and electrically coupled to the board 1702. In some implementations the at least one communication chip 1706 is also physically and electrically coupled to the board 1702. In further implementations, the communication chip 1706 is part of the processor 1704.

Depending on its applications, computing device 1700 may include other components that may or may not be physically and electrically coupled to the board 1702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1706 enables wireless communications for the transfer of data to and from the computing device 1700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1700 may include a plurality of communication chips 1706. For instance, a first communication chip 1706 may be dedicated to shorter range wireless communications such as Wi-Fi and Bluetooth and a second communication chip 1706 may be dedicated to longer range wireless communications such as GPS, EDGE, GPRS, CDMA, WiMAX, LTE, Ev-DO, and others.

The processor 1704 of the computing device 1700 includes an integrated circuit die packaged within the processor 1704. In an embodiment, the integrated circuit die of the processor may comprise an RFT, an RNWT, or an RNST, such as those described herein. The term "processor" may refer to any device or portion of a device that processes electronic data from registers and/or memory to transform that electronic data into other electronic data that may be stored in registers and/or memory.

The communication chip 1706 also includes an integrated circuit die packaged within the communication chip 1706. In an embodiment, the integrated circuit die of the communication chip may comprise an RFT, an RNWT, or an RNST, such as those described herein.

In further implementations, another component housed within the computing device 1700 may comprise an RFT, an RNWT, or an RNST, such as those described herein.

In various implementations, the computing device 1700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1700 may be any other electronic device that processes data.

Figure 18:
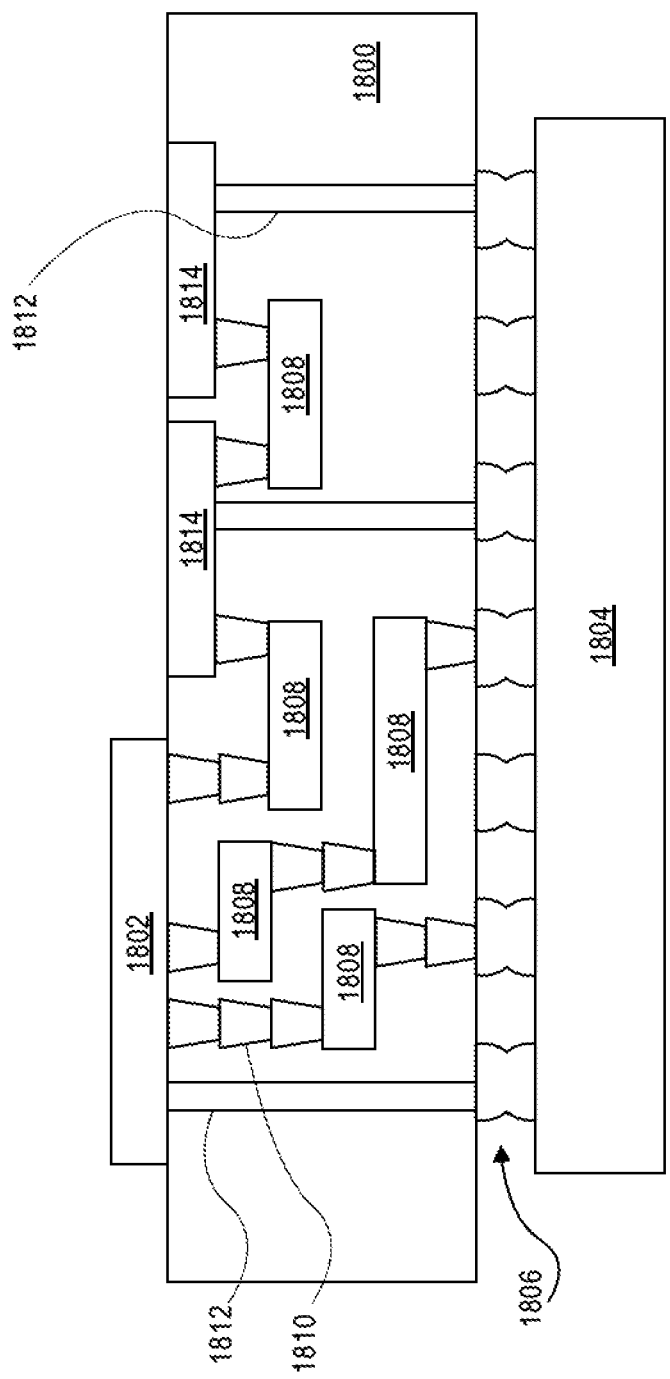
FIG. 18 is an interposer implementing one or more embodiments of the disclosure.

FIG. 18 illustrates an interposer 1800 that includes one or more embodiments of the disclosure. The interposer 1800 is an intervening substrate used to bridge a first substrate 1802 to a second substrate 1804. The first substrate 1802 may be, for instance, an integrated circuit die. The second substrate 1804 may be, for instance, a memory module, a computer motherboard, or another integrated circuit die. In an embodiment, one of both of the first substrate 1802 and the second substrate 1804 may comprise an RFT, an RNWT, or an RNST, in accordance with embodiments described herein. Generally, the purpose of an interposer 1800 is to spread a connection to a wider pitch or to reroute a connection to a different connection. For example, an interposer 1800 may couple an integrated circuit die to a ball grid array (BGA) 1806 that can subsequently be coupled to the second substrate 1804. In some embodiments, the first and second substrates 1802/1804 are attached to opposing sides of the interposer 1800. In other embodiments, the first and second substrates 1802/1804 are attached to the same side of the interposer 1800. And in further embodiments, three or more substrates are interconnected by way of the interposer 1800.

The interposer 1800 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials The interposer may include metal interconnects 1808 and vias 1810, including but not limited to through-silicon vias (TSVs) 1812. The interposer 1800 may further include embedded devices 1814, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1800. In accordance with embodiments of the disclosure, apparatuses or processes disclosed herein may be used in the fabrication of interposer 1800.

Thus, embodiments of the present disclosure may comprise an RFT, an RNWT, or an RNST, and the resulting structures.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: a resonator, comprising: a substrate; a set of contact fins over the substrate; a first contact proximate to a first end of the set of contact fins; a second contact proximate to a second end of the set of contact fins; a set of skip fins over the substrate and adjacent to the set of contact fins; and a gate electrode over the set of contact fins and the set of skip fins, wherein the gate electrode is between the first contact and the second contact.

Example 2: the resonator of Example 1, wherein individual ones of the skip fins have a first height under the gate electrode and a second height outside the gate electrode, wherein the second height is smaller than the first height.

Example 3: the resonator of Example 2, wherein individual ones of the contact fins comprise an epitaxially grown tip over tops of the contact fins.

Example 4: the resonator of Examples 1-3, wherein the set of contact fins and the set of skip fins comprise a first pitch that is different than a second pitch of a set of device fins on the substrate.

Example 5: the resonator of Examples 1-4, further comprising: a plurality of fin stumps, wherein individual fin stumps are between individual ones of the contact fins and individual ones of the skip fins.

Example 6: the resonator of Example 5, wherein the contact fins and the skip fins have a first pitch, and wherein a set of device fins have a second pitch that is different than the first pitch.

Example 7: the resonator of Example 6, wherein the first pitch is an integer multiple of the second pitch.

Example 8: the resonator of Examples 1-7, further comprising: an electrically insulating layer over portions of the skip fins outside of the gate electrode.

Example 9: the resonator of Examples 1-8, wherein footprints of the first contact and the second contact are within outer edges of the set of contact fins.

Example 10: the resonator of Examples 1-9, wherein the set of contact fins and the set of skip fins have recessed top surfaces, and wherein epitaxial tips are grown over only individual ones of the contact fins.

Example 11: the resonator of Examples 1-10, further comprising: a second gate electrode over the set of contact fins and the set of skip fins, wherein the second gate electrode is between the first contact and the second contact.

Example 12: the resonator of Example 11, wherein a first height of individual ones of the skip fins under the gate electrode, under the second gate electrode, and between the gate electrode and the second gate electrode is larger than a second height of individual ones of the skip fins outside the gate electrode and the second gate electrode.

Example 13: the resonator of Example 1-12, wherein a number of contact fins in the set of contact fins is an odd number, and wherein a number of skip fins in the set of skip fins is an even number.

Example 14: the resonator of Example 13, wherein the number of contact fins is three, and wherein the number of skip fins is four.

Example 15: a resonator, comprising: a substrate; a plurality of cells arranged end to end over the substrate, wherein each cell comprises: a set of contact fins over the substrate; a first contact proximate to a first end of the set of contact fins; a second contact proximate to a second end of the set of contact fins; and a set of skip fins over the substrate and adjacent to the set of contact fins; and a gate electrode over the set of contact fins and the set of skip fins in each cell, wherein the gate electrode is between the first contact and the second contact.

Example 16: the resonator of Example 15, further comprising: a set of dummy fins between the cells.

Example 17: the resonator of Example 15 or Example 16, wherein a total length of the resonator is approximately 1 μm or greater.

Example 18: the resonator of Examples 15-17, further comprising: epitaxially grown tips over individual ones of the contact fins.

Example 19: a semiconductor device, comprising: a first nanowire transistor with a first nanowire and a second nanowire over the first nanowire; a second nanowire transistor with a third nanowire and a fourth nanowire over the third nanowire; a first contact, wherein the drain contact is electrically coupled to the first nanowire, the second nanowire, the third nanowire, and the fourth nanowire; a gate electrode, wherein the gate electrode is electrically coupled to the first nanowire, the second nanowire, the third nanowire, and the fourth nanowire; a second contact, wherein the second contact is electrically coupled to the first nanowire and the fourth nanowire; and a third contact, wherein the third contact is electrically coupled to the second nanowire and the third nanowire.

Example 20: the semiconductor device of Example 19, wherein the second contact is an opposite phase from the third contact.

Example 21: the semiconductor device of Example 19 or Example 20, further comprising: a set of drive nanowire transistors, wherein a source and a drain of individual ones of the drive nanowire transistors are shorted together.

Example 22: the semiconductor device of Example 21, wherein the set of drive nanowire transistors comprises first drive nanowire transistors and second drive nanowire transistors, wherein the source and drain of individual ones of the first drive nanowire transistors is an opposite phase from the source and drain of individual ones of the second drive nanowire transistors.

Example 23: an electronic device, comprising: a board; a package substrate attached to the board; and a die electrically coupled to the package substrate, wherein the die comprises a resonator, wherein the resonator comprises: a plurality of cells arranged end to end over a substrate, wherein each cell comprises: a set of contact fins over the substrate; a first contact proximate to a first end of the set of contact fins; a second contact proximate to a second end of the set of contact fins; and a set of skip fins over the substrate and adjacent to the set of contact fins; and a gate electrode over the set of contact fins and the set of skip fins in each cell, wherein the gate electrode is between the first contact and the second contact.

Example 24: the electronic device of Example 23, further comprising: a second resonator, wherein a resonant frequency of the second resonator is different than a resonant frequency of the resonator.

Example 25: the electronic device of Example 23 or Example 24, wherein a total length of the resonator is approximately 1 μm or greater.

What is claimed is:

1. A resonator, comprising:
a substrate;
a set of contact fins over the substrate;

a first contact proximate to a first end of the set of contact fins;
a second contact proximate to a second end of the set of contact fins;
a set of skip fins over the substrate and adjacent to the set of contact fins, wherein a portion of the set of skip fins is laterally adjacent to the first contact or the second contact; and
a gate electrode over the set of contact fins and the set of skip fins, wherein the gate electrode is between the first contact and the second contact.

2. The resonator of claim 1, wherein individual ones of the skip fins have a first height under the gate electrode and a second height outside the gate electrode, wherein the second height is smaller than the first height.

3. The resonator of claim 2, wherein individual ones of the contact fins comprise an epitaxially grown tip over tops of the contact fins.

4. The resonator of claim 1, wherein the set of contact fins and the set of skip fins comprise a first pitch that is different than a second pitch of a set of device fins on the substrate.

5. The resonator of claim 1, further comprising:
an electrically insulating layer over portions of the skip fins outside of the gate electrode.

6. The resonator of claim 1, wherein footprints of the first contact and the second contact are within outer edges of the set of contact fins.

7. The resonator of claim 1, wherein the set of contact fins and the set of skip fins have recessed top surfaces, and wherein epitaxial tips are grown over only individual ones of the contact fins.

8. The resonator of claim 1, further comprising:
a second gate electrode over the set of contact fins and the set of skip fins, wherein the second gate electrode is between the first contact and the second contact.

9. The resonator of claim 8, wherein a first height of individual ones of the skip fins under the gate electrode, under the second gate electrode, and between the gate electrode and the second gate electrode is larger than a second height of individual ones of the skip fins outside the gate electrode and the second gate electrode.

10. The resonator of claim 1, wherein a number of contact fins in the set of contact fins is an odd number, and wherein a number of skip fins in the set of skip fins is an even number.

11. The resonator of claim 10, wherein the number of contact fins is three, and wherein the number of skip fins is four.

12. A resonator, comprising:
a substrate;
a set of contact fins over the substrate;
a first contact proximate to a first end of the set of contact fins;
a second contact proximate to a second end of the set of contact fins;
a set of skip fins over the substrate and adjacent to the set of contact fins; and
a gate electrode over the set of contact fins and the set of skip fins, wherein the gate electrode is between the first contact and the second contact; and
a plurality of fin stumps, wherein individual fin stumps are between individual ones of the contact fins and individual ones of the skip fins.

13. The resonator of claim 12, wherein the contact fins and the skip fins have a first pitch, and wherein a set of device fins have a second pitch that is different than the first pitch.

14. The resonator of claim 13, wherein the first pitch is an integer multiple of the second pitch.

15. A resonator, comprising:
a substrate;
a plurality of cells arranged end to end over the substrate, wherein each cell comprises:
a set of contact fins over the substrate;
a first contact proximate to a first end of the set of contact fins;
a second contact proximate to a second end of the set of contact fins; and
a set of skip fins over the substrate and adjacent to the set of contact fins, wherein a portion of the set of skip fins is laterally adjacent to the first contact or the second contact; and
a gate electrode over the set of contact fins and the set of skip fins in each cell, wherein the gate electrode is between the first contact and the second contact.

16. The resonator of claim 15, further comprising:
a set of dummy fins between the cells.

17. The resonator of claim 15, wherein a total length of the resonator is approximately 1 µm or greater.

18. The resonator of claim 15, further comprising:
epitaxially grown tips over individual ones of the contact fins.

19. A semiconductor device, comprising:
a first nanowire transistor with a first nanowire and a second nanowire over the first nanowire;
a second nanowire transistor with a third nanowire and a fourth nanowire over the third nanowire;
a first contact, wherein the first contact is electrically coupled to the first nanowire, the second nanowire, the third nanowire, and the fourth nanowire;
a gate electrode, wherein the gate electrode is electrically coupled to the first nanowire, the second nanowire, the third nanowire, and the fourth nanowire;
a second contact, wherein the second contact is electrically coupled to the first nanowire and the fourth nanowire;
a third contact, wherein the third contact is electrically coupled to the second nanowire and the third nanowire; and
a set of drive nanowire transistors, wherein a source and a drain of individual ones of the drive nanowire transistors are shorted together.

20. The semiconductor device of claim 19, wherein the second contact is an opposite phase from the third contact.

21. The semiconductor device of claim 19, wherein the set of drive nanowire transistors comprises first drive nanowire transistors and second drive nanowire transistors, wherein the source and drain of individual ones of the first drive nanowire transistors is an opposite phase from the source and drain of individual ones of the second drive nanowire transistors.

22. An electronic device, comprising:
a board;
a package substrate attached to the board; and
a die electrically coupled to the package substrate, wherein the die comprises a resonator, wherein the resonator comprises:
a plurality of cells arranged end to end over a substrate, wherein each cell comprises:
a set of contact fins over the substrate;
a first contact proximate to a first end of the set of contact fins;
a second contact proximate to a second end of the set of contact fins; and a set of skip fins over the substrate and adjacent to the set of contact fins, wherein a portion of the set of skip fins is laterally adjacent to the first contact or the second contact; and a gate electrode over the set of contact fins and the set of skip fins in each cell, wherein the gate electrode is between the first contact and the second contact.

23. The electronic device of claim 22, further comprising:

a second resonator, wherein a resonant frequency of the second resonator is different than a resonant frequency of the resonator.

24. The electronic device of claim 22, wherein a total length of the resonator is approximately 1 μm or greater.

* * * * *